(12) United States Patent
Schaper et al.

(10) Patent No.: US 12,712,298 B2
(45) Date of Patent: Aug. 18, 2026

(54) ELECTRIC COMPONENT, IN PARTICULAR TERMINAL BLOCK, COMPRISING A SOCKET FOR RECEIVING A RECEIVING COMPONENT

(71) Applicant: Phoenix Contact GmbH & Co. KG, Blomberg (DE)

(72) Inventors: Elmar Schaper, Lügde (DE); Frank Herden, Bad Salzuflen (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 1020 days.

(21) Appl. No.: 17/783,504

(22) PCT Filed: Dec. 8, 2020

(86) PCT No.: PCT/EP2020/085142
§ 371 (c)(1),
(2) Date: Nov. 15, 2022

(87) PCT Pub. No.: WO2021/116132
PCT Pub. Date: Jun. 17, 2021

(65) Prior Publication Data

US 2023/0146590 A1 May 11, 2023

(30) Foreign Application Priority Data

Dec. 9, 2019 (DE) ..................... 10 2019 133 577.9
Dec. 9, 2019 (DE) ..................... 10 2019 133 578.7
(Continued)

(51) Int. Cl.
*H01R 9/26* (2006.01)
*H01R 9/16* (2006.01)
*H05K 7/14* (2006.01)

(52) U.S. Cl.
CPC ............. *H01R 9/2633* (2013.01); *H01R 9/16* (2013.01); *H05K 7/14* (2013.01)

(58) Field of Classification Search
None
See application file for complete search history.

(56) References Cited

U.S. PATENT DOCUMENTS 4,241,966 A * 12/1980 Gomez ............. H01R 12/7005 439/372
5,672,072 A 9/1997 Arai et al.
(Continued)

FOREIGN PATENT DOCUMENTS

CN 1452273 A 10/2003
CN 1725939 A 1/2006
(Continued)

OTHER PUBLICATIONS

English translation of PCT International Preliminary Report on Patentability, Int. App. No. PCT/EP2020/085139, Int. Filing Date: Dec. 8, 2020, Agent Ref: 19PH0456WOP, Dated: Jun. 23, 2022.
(Continued)

*Primary Examiner* — Allen L Parker
*Assistant Examiner* — Christopher L Augustin
(74) *Attorney, Agent, or Firm* — Reising Ethington P.C.

(57) ABSTRACT

An electrical component is provided, comprising at least one plug-in socket for receiving an accommodated component, in particular a relay or an optocoupler, in or on the electrical component, wherein the accommodated component having first electrical contact elements on its underside, for being electrically connected to second electrical contact elements of the electrical component, and wherein in an active position of the accommodated component, the first electrical contact elements are electrically connected with the second electrical contact elements on the plug-in socket, and com-
(Continued)

prising a manipulation means, by means of which the accommodated component can be plugged into the active position in the plug-in socket and/or pulled out thereof, wherein the manipulation means has a spacing portion, and wherein a free end of the spacing portion protrudes beyond the electrical component and/or beyond the accommodated component that is inserted in the plug-in socket in the active position.

18 Claims, 31 Drawing Sheets

(30) Foreign Application Priority Data

Jul. 7, 2020 (DE) ..................... 10 2020 117 917.0
Sep. 30, 2020 (DE) ..................... 10 2020 125 502.0

(56) References Cited

U.S. PATENT DOCUMENTS

| | | | | |
|---|---|---|---|---|
| 2002/0132504 | A1 | 9/2002 | Mori et al. | |
| 2007/0263345 | A1 | 11/2007 | Adunka et al. | |
| 2014/0213117 | A1* | 7/2014 | Trinh | H01R 13/20 439/660 |
| 2016/0118754 | A1 | 4/2016 | Kawamura | |
| 2017/0170600 | A1* | 6/2017 | Tezgurler | H01R 13/6275 |
| 2018/0115107 | A1 | 4/2018 | Correll et al. | |
| 2019/0044282 | A1* | 2/2019 | Mickmann | H01R 13/633 |

FOREIGN PATENT DOCUMENTS

| | | | |
|---|---|---|---|
| CN | 107623226 | A | 1/2018 |
| CN | 109390796 | A | 2/2019 |
| DE | 19515358 | A1 | 12/1995 |
| DE | 29611543 | U1 | 9/1996 |
| DE | 10213854 | A1 | 1/2003 |
| DE | 202007004414 | U1 | 5/2007 |
| DE | 202007005373 | U1 | 8/2008 |
| DE | 112014003947 | T5 | 6/2016 |
| DE | 102016112663 | A1 | 1/2018 |
| DE | 202017101346 | U1 | 7/2018 |
| DE | 102017122446 | B3 | 3/2019 |
| DE | 102018109861 | A1 | 10/2019 |
| EP | 1353409 | A1 | 10/2003 |
| EP | 1381068 | A1 | 1/2004 |
| EP | 3270465 | A1 | 1/2018 |
| EP | 3439011 | A1 | 2/2019 |

OTHER PUBLICATIONS

English translation of PCT International Preliminary Report on Patentability, Int. App. No. PCT/EP2020/085140, Int. Filing Date: Dec. 8, 2020, Agent Ref: 19PH0457WOP, Dated: Jun. 23, 2022.

English translation of PCT International Preliminary Report on Patentability, Int. App. No. PCT/EP2020/085141, Int. Filing Date: Dec. 8, 2020, Agent Ref: 20PH0013WOP, Dated: Jun. 23, 2022.

English translation of PCT International Preliminary Report on Patentability, Int. App. No. PCT/EP2020/085142, Int. Filing Date: Dec. 8, 2020, Agent Ref: 20PH0063WOP, Dated: Jun. 23, 2022.

European Office Action corresponding to application 20824482.2, dated Apr. 2, 2025, 8 pages.

Chinese Office Action and Search Report corresponding to application 202080095577.9, dated May 19, 2023, 11 pages.

International Search Report and Written Opinion, Int. Serial No. PCT/EP2020/085142, Applicant: Phoenix Contact GmbH & Co. KG, Date: Mar. 15, 2021.

DE Office Action, Serial No. 10 2019 133 577.9, Applicant: Phoenix Contact GmbH & Co. KG, Date: Aug. 13, 2020.

International Search Report and Written Opinion, Int. Serial No. PCT/EP2020/085141, Applicant: Phoenix Contact GmbH & Co. KG, Date: Mar. 16, 2021.

International Search Report and Written Opinion, Int. Serial No. PCT/EP2020/085140, Applicant: Phoenix Contact GmbH & Co. KG, Date: Mar. 15, 2021.

DE Office Action, Serial No. 10 2019 133 578.7, Applicant: Phoenix Contact GmbH & Co. KG, Date: Oct. 19, 2020.

Intemational Search Report and Written Opinion, Int. Serial No. PCT/EP2020/085139, Applicant: Phoenix Contact GmbH & Co. KG, Date: Mar. 1, 2021.

International Patent Application filed Dec. 8, 2020, Reference No. 19PH0456WOP, Applicant: Phoenix Contact GmbH & Co. KG.

* cited by examiner 7
6
5
120
34
58a
58
124
8
35
104
4
50
1
52+57
3
114
11
X2
2
110a
112
110
Y4
14
Y1
X1
1
45
Y3
12
Y2
102
100

120

104
7
58
9
35
8
50
4
1
52
3
114
9
57
110a
112
110
45
1
100
102

26

105
13
7
D
12
6
11
E
10
120
8
26

104
105
14
7
D
11
F
6
E
13
120
8

126

26
122
16
15
120
8
126

26
16
122
17
18
15
120
8

104
26
16
20
17
18
126
8
19
120
8, 18, 19

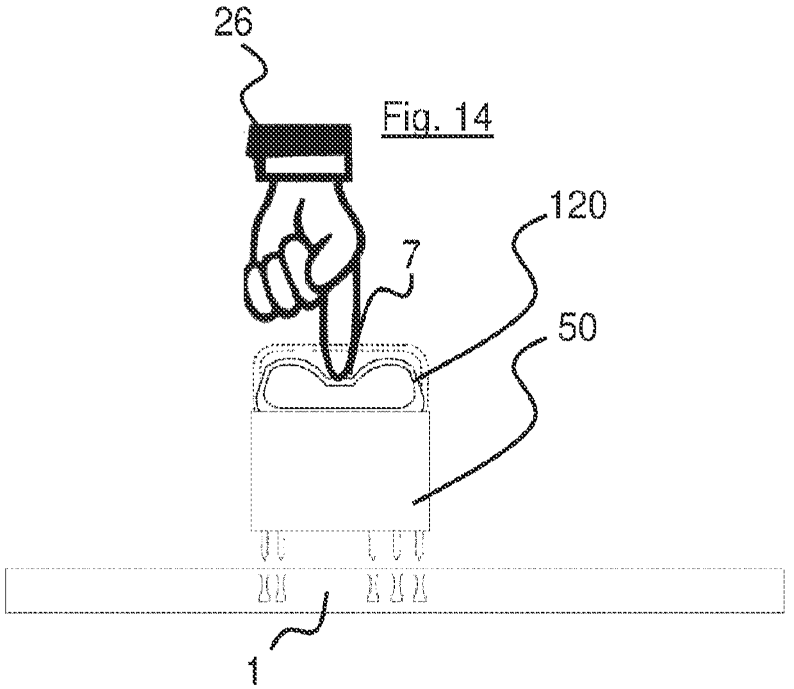
26
Fig. 14
120
7
50
1
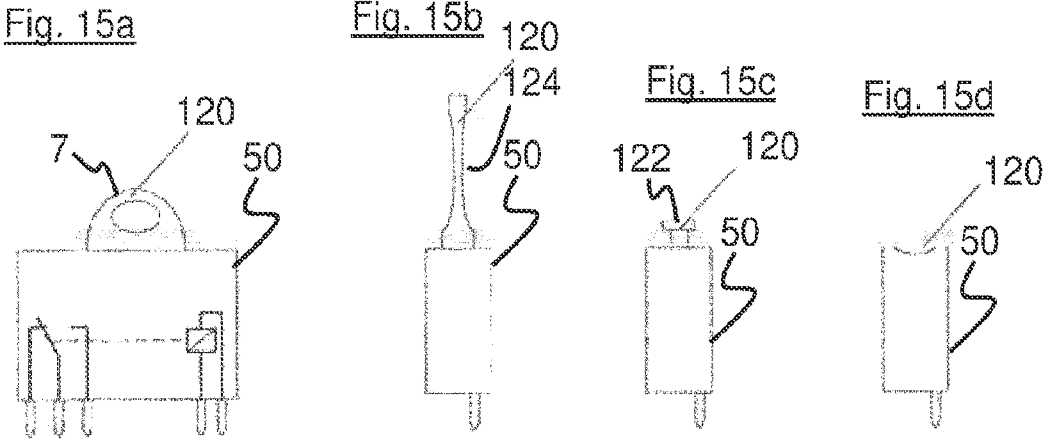
Fig. 15a
7
120
50
Fig. 15b
120
124
50
Fig. 15c
122
120
50
Fig. 15d
120
50

201
202
2120
219
230a
203
204
205
230
206
218
220
207
217
216
208
209
213
210
211
214
212
215
221
2100

2120
201
2110
219
2100
234
232
206

2110
219
2100
205
201
2120
205a
206
209
209a
234
232

2110
2120
219a
219b
2100
234a
219c
234b
234c
201
234
206
232

219a
219b
2110
219c
2100
234a
205a
205
201
2120
206
234b
234c
209
209a
232

2110
202a
236a
2120
202b
236b
201
2110
19a
202c
236c
2100
234a
206
232

219d
2110
202a
202b
202c
236a
2100
205b
236b
205
201
2120
205c
236c
205a
209c
209
209a
209b
234a
232

327
348
315
3150
316
328
346
308
313
307
309
310
312
317
311
3140
352
306
318
305
3114
319
320
304
3112
3110
303
3120
3120
321
322
302
323
324
301
325
3100
326

331
330
3150
348
346
3112
334
3120
333
332
3114
110a
335
3110
3120
3100

3150
346
348
3112
A
3114
3110
3110a
3100

3150
344
343
342
341
340
348
345
346
3112
339
338
3114
11
X2
337
3110
336
Y4
14
Y1
X1
Y3
12
Y2
3100

3150
351

3114
3112
3110a
3110
3100

307
308
309
312
311
314
350
346
347
310
349
348
331
333
334
324
3150

425
4118
415
414
411
4116
4110
446
424
405
416
437
438
410
4102
448
428
417
427
4104
4112
423
429
4100
426

4118
408
409
410
411
412
413
414
407
415
406
405
404
403
416
417
402
418
401
4104
4112
419
420
421
422
423
4100

450
405
4118
437
438
452
439
440
464
462
4110a
461
4104
4104a
4112
4122
4100

ELECTRIC COMPONENT, IN PARTICULAR TERMINAL BLOCK, COMPRISING A SOCKET FOR RECEIVING A RECEIVING COMPONENT

TECHNICAL FIELD

The present disclosure relates to an electrical device, for example a terminal block, in particular with at least one accommodated component for being mounted in the electrical device, and to an electrical device with a mounted accommodated component.

BACKGROUND AND GENERAL DESCRIPTION OF THE DISCLOSURE

Electrical components for plug-in assembly of components to be accommodated, such as in particular relays or optocouplers, are known. The accommodated components that are plugged into the electrical component are typically adapted so as to be removable, so that they can be removed for being replaced, such as in the case of a defect, or so as to provide the option to select an appropriate accommodated component for a standardized electrical component and to connect it thereto.

So-called ejectors are used on the electrical component in order to remove the accommodated component. Ejectors can be actuated either with or without tools. Such electrical components with an ejector are known from published documents EP 3 439 011 A1, DE 10 2017 122 446 B3, for example, and also from DE 20 2007 004 414 U1.

The present disclosure addresses the further development of known electrical components, with particular attention to structural improvements, in particular regarding the insertion or removal of the accommodated components, for example with regard to relays, optocouplers, solid state relays, electronic measuring amplifiers, or analog-to-digital converters which contain electrical or electronic components. These accommodated components are adapted to be employed in particular in electrical components that can be implemented with an even narrower design than hitherto.

Typically, electrical contact elements, or terminals, are provided in the electrical component for electrically connecting the accommodated component in the electrical component. Such terminals can possibly have a minimum spacing, with regard to minimum insulation distances to be observed. Typically, the electrical contacts or terminals are arranged in a row, for example to provide the appropriate minimum distances for electrically insulating the terminals from one another.

Such electrical components are typically mounted on mounting supports such as mounting rails, in particular top hat rails, also known as DIN rails. The installation width occupied by the electrical component on the mounting support is relevant here, since the mounting support is intended for a large number of electrical components to be arranged next to one another. Since the length of a mounting rail is typically limited, for example in the installation space of an assembly space, and since as many electrical components as possible are desired to be arranged next to each other per mounting rail, the overall width of the electrical components constitutes a key competitive factor. The electrical contacts of each electrical component are arranged in a direction perpendicular to the extension direction of the carrier, i.e. perpendicular to the main extension direction of the mounting or component support, in order to further reduce the installation width of the individual electrical components. The main extension direction of the mounting or component support extends parallel to the longitudinal axis thereof, i.e. along the rail in the typical case of a top hat rail. In this case, the electrical contacts are preferably arranged in a plane that intersects the mounting or component support at a right angle. For easy assembly it may be desirable to arrange the electrical contacts of the component next to one another in the horizontal direction and perpendicular to the main extension direction of the mounting or component support. Nowadays, typical installation widths of an electrical component range from 12 mm to 6 mm, for example.

Given the background of prior art designs of electrical components, the present disclosure has set itself the task of further enabling a replacement, i.e. insertion or removal of the accommodated component from or into a plug-in socket, and/or to simplify the replacement for the case of such and even narrower designs. The difficulty encountered here is how to reliably eject the accommodated components, which are becoming increasingly narrower as the installation width of the electrical devices becomes smaller, or even to reach the accommodated components when they are installed in the plug-in socket of the electrical device close to other electrical devices, in particular when a plurality of electrical components are mounted next to each other, for example on a top hat rail, as is often the case.

This object may be achieved by the subject-matter of the independent patent claims. Advantageous embodiments of the invention may be defined in the dependent claims. According to the present disclosure, an electrical component is presented, in particular a terminal block, which comprises a plug-in socket for receiving an accommodated component, such as a relay or an optocoupler, in the electrical component. The accommodated component has first electrical contact elements on its underside for being electrically connected to second electrical contact elements of the electrical component. In other words, the electrical component has an accommodation space or an accommodation opening into which the accommodated component, for example the relay or the optocoupler, can be inserted or plugged in and can also be electrically connected there in this accommodation space. Thus, the accommodated component is received in, i.e. plugged into the plug-in socket of the electrical component at least partially. The accommodated component is electrically connected to the electrical component via the plug-in socket, and the accommodated component can be easily removed and electrically separated, i.e. disconnected from the plug-in socket if this should be necessary or desired. The removal or electrical separation of the accommodated component from the plug-in socket is in particular non-destructive, i.e. it can preferably be removed by being pulled out or ejected, without having to carry out complex disassembly processes such as desoldering for example.

The electrical connection is typically established when the accommodated component is installed in the plug-in socket. For example, the accommodated component is retained in the plug-in socket by the fact that the first electrical contact elements of the accommodated component are plugged into the second electrical contact elements, e.g. female terminals, thereby generating a retaining force on the first electrical contact elements and hence on the accommodated component.

The accommodated component may be a known relay module or optocoupler module, which are adapted for use in such electrical components as in particular terminal blocks. Existing components to be accommodated can be used in this case, for example, and new components to be accommodated do not have to be kept in stock. Different functionalities can be realized by simply exchanging the accommodated component. Therefore, preferably no changes are necessary to the casing of the known components to be accommodated in order to employ the present disclosure. In other words, the present disclosure is particularly compatible with previous designs of components to be accommodated. This permits to increase the acceptance of the novel electrical devices. Finally, the implementation according to the present disclosure also allows the exchange of an accommodated component in the case of very small installation widths.

The accommodated component typically comprises a separate housing and may optionally also include other components in a shared housing, in addition to the relay mentioned by way of example. The accommodated component is typically adapted to interact with and/or be controlled by the electrical component to which it is assigned or into which it is introduced.

The plug-in socket of the electrical component is preferably structured so as to comprise first and second side walls of the plug-in socket. The plug-in socket is preferably open at its lateral side, i.e. it has no side walls along its longitudinal sides. Here, the longitudinal sides are the sides facing the adjacent electrical components when the electrical component is in its mounted state, i.e. the sides of the plug-in socket facing in the main extension direction of the mounting or component support. The narrow sides are respectively arranged between the longitudinal sides. Thus, the plug-in socket has the first and second side walls provided on its narrow sides, so that the plug-in socket has an overall U-shaped design when the electrical component is viewed from the side. In other words, the first and second side walls of the plug-in socket provide guiding sides for the accommodated component, between which the accommodated component can be arranged at least partially, or sections thereof, so that the accommodation space for the accommodated component is defined between the side walls. The omission of side walls on the longitudinal sides of the plug-in socket further reduces the overall installation width of the electrical device in the direction of the main extension direction of the mounting or component support.

The second electrical contact elements are provided in a bottom of the plug-in socket, spatially arranged between the first and/or second side walls. It should not be ruled out here to have one or more further electrical contact elements provided within the range of the first and/or second side walls of the plug-in socket; it has just proven desirable to arrange the second electrical contact elements in the bottom of the plug-in socket.

The electrical component according to the present disclosure comprises a manipulation means, which can be used to insert the accommodated component into the active position in the plug-in socket and/or to pull it out of the active position. The accommodated component has assumed its active position when an electrical connection is established between the accommodated component and the electrical contacts, or terminals, of the plug-in socket.

Particularly preferably, the manipulation means provides for a simplification in operation and/or handling. Moreover, the manipulation means allows to further reduce the force that has to be exerted by the user, because it provides a longer lever. Finally, the manipulation means can also bring about all the aforementioned advantages at the same time.

The manipulation means has a spacing portion, and a free end of the spacing portion protrudes beyond the electrical component and/or beyond the accommodated component that is installed in the plug-in socket in its active position. In other words, a major portion of the manipulation means is arranged above the electrical component and is higher than the electrical component in particular when viewed in a side view of the electrical component, so that the manipulation means can be easily grasped or easily reached from above the electrical component. In order to enhance this effect, the manipulation means may have a grip means on the free end of the spacing portion. The grip means is characterized by the fact that it further simplifies the gripping of the manipulation means. For example, the grip means can be haptically recognized or grasped particularly easily, when it is held clamped with two fingers, for example, it can improve the adhesive power or frictional engagement of the fingers on the spacing portion of the manipulation means. The grip means can also be designed so that the manipulation means can be gripped more easily with fingers or with a tool, for example by having a thickening, an enlargement, or a rubber coating on the grip means. The manipulation means can constitute an insertion aid and/or an extraction aid, by means of which the accommodated component can accordingly more easily be inserted and/or extracted from its active position.

The grip means may be in the form of a tab on the free end of the spacing portion, which can be grasped in particular manually. The grip means may be in the form of a T-bar or annular tab which can be gripped in particular using a suitable hand tool in order to pull the accommodated component out of the plug-in socket or to press it into its active position in the plug-in socket. The spacing portion may be in the form of a lever, in particular a flexible lever. Such a lever can be considered to be a rod-shaped elongated structure, for example with a length-to-thickness ratio of 10:1 or more, preferably 20:1 or more, more preferably even 40:1 or more.

The manipulation means is preferably non-detachably connected to the electrical component on a fixed end thereof opposite its free end. The manipulation means can thus be a protuberance that is provided on the upper side of the electrical component, or an apparatus connected to the upper side of the electrical component. The manipulation means may be glued or screwed to the electrical component or formed integrally therewith, in particular with the housing of the electrical component.

The electrical component furthermore comprises an ejection device adapted for releasing and/or at least partially ejecting the accommodated component from the active position. The fixed end of the manipulation means is connected to the ejection device of the electrical component and/or is integrally formed with the ejection device. In this embodiment, which is fully compatible and can be combined with all of the illustrated embodiments, the manipulation means is hence firmly connected to the ejection device, so that the ejection device is actuated when the manipulation means is actuated. If, for example, the manipulation means is pulled, a pulling force can thereby also be exerted on the ejection device, which at that moment will eject the accommodated component plugged into the plug-in socket. On the other hand, pressing on the manipulation means, for example, will at the same time exert a pressure on the ejection device in order to move an accommodated component into its active position in the plug-in socket. If a transmission is arranged between the manipulation means and the ejection device, the directions of movement can also be reversed such that, for example, a pulling force on the manipulation means will exert a pressure force on the ejection device and a pressure force on the manipulation means will cause a pulling force to be transmitted to the ejection device. The manipulation means is preferably formed integrally with the ejection device. In any case, in an integrally formed design, a portion of the ejection device will be integrally formed with the manipulation means.

The ejection device may comprise an actuation portion for actuating the ejection device, which can be actuated in particular by a hand tool. In this case, the manipulation means is connected to the actuation portion of the ejection device in a non-detachable manner.

The ejecting device may furthermore comprise an ejecting portion that is coupled to the actuation portion and adapted for ejecting an accommodated component from the plug-in socket when the actuation portion is actuated. The ejection portion is adapted and arranged so as to engage on the accommodated component in a common contact plane for ejecting the accommodated component from the active position in the plug-in socket.

The manipulation means is in particular adapted such that the ejection device is actuated when a pulling force is exerted on the manipulation means. The manipulation means may also be adapted such that the pulling force can be exerted on the manipulation means in a direction other than the pull-out direction of the accommodated component from the accommodation slot. In other words, the manipulation means can be pulled in a direction that does not correspond to the direction an accommodated component would have to be pulled in order to pull it out of the slot. Typically, the accommodated component would be pulled out of the electrical component in a direction vertically upwards; in this case the pulling force would need to be exerted in a direction vertically upwards if no manipulation means was provided. The use of a manipulation means on the electrical component makes it possible to pull in a horizontal direction, for example, away from the electrical component, and thereby push the accommodated component upwards, out of the plug-in socket. This can be advantageous if the installation space above the electrical component is limited to an extent where it is difficult to manipulate there manually or with tools and/or if there would be a risk of injuring the hand when exerting the pulling force directed vertically upwards away from the electrical component. It is often also more comfortable and convenient to pull in the horizontal direction, for example towards the body of a user who is standing in front of the control cabinet and desires to remove an accommodated component, than to pull upwards when the installation space is limited there. This can even open up the possibility to arrange the electrical components even closer to one another, by arranging the mounting rails closer to one another, i.e. usually top hat rails, since less installation space is required if no open space needs to be kept above the electrical components to allow for manual handling there. Rather, the manipulation means according to the present disclosure makes it possible to get along with a narrow space above the electrical components, which is just large enough for the accommodated components to be maneuvered into the corresponding accommodation slot.

The force vector of the pulling force exerted on the manipulation means for actuating the ejection device can preferably lie in the contact plane. The pulling force on the manipulation means can also be exerted at an angle of >30°, preferably >60°, up to approximately perpendicular to the pull-out direction of the accommodated component.

The accommodated component can be transferred into the active position in the accommodation slot by exerting a pressure force on the manipulation means. This configuration also helps to make it possible to further reduce the installation space in the control cabinet, if the accommodated component only has to be approached to the accommodation slot and the accommodated component is pressed into the accommodation slot by actuating the manipulation means in particular in a direction that is not vertical to the electrical component. In this way, the accommodated component is transferred into its active position with the aid of the manipulation means.

The electrical component may comprise a retaining means for retaining the accommodated component in a passive position on the electrical component, and in this passive position the first electrical contacts of the accommodated component are electrically separated, i.e. disconnected, from the second electrical contacts of the electrical component.

The second electrical contact elements or part thereof can be arranged in a common contact plane in the plug-in socket. The contact plane extends through the first contact elements of the accommodated component when the accommodated component is plugged into the plug-in socket.

The retaining means can be arranged and adapted so that, when the ejection device is actuated, the accommodated component is automatically transferred into its passive position and is held there by the retaining means. The retaining means may also be automatically enabled or provided when the ejection device is actuated. In other words, when the ejection device is actuated, the accommodated component is released from the active position in the plug-in socket and is ejected or pushed out of the plug-in socket to an extent so that it assumes the passive position on the retaining means. The retaining means is adapted so as to reliably hold the accommodated component in the passive position so that it cannot be removed or moved out of the passive position without external intervention. For example, the retaining means is able to catch an accommodated component which is ejected with a rather great force and which would otherwise possibly be accelerated so as to jump out of the plug-in socket. Such an accommodated component jumping out of the plug-in socket might entail inconvenient consequences, such as possibly inflicting injury to the user's face, and the accommodated component might also get lost, for example in the control cabinet. Lastly, the accommodated component could also be damaged. The present disclosure is able to overcome these drawbacks by introducing the modified and hence improved electrical component.

In the active position, an electrical connection is established between the first electrical contacts of the accommodated component and the second electrical contacts of the electrical component. In the passive position, by contrast, the first electrical contacts of the accommodated component are electrically separated from the second electrical contacts of the electrical component. The retaining means ensures to achieve the electrical separation of the contacts in the passive position and at the same time to retain the accommodated component on the electrical component in the passive position.

The retaining means can be connected to the manipulation means or can be formed integrally with the manipulation means. Furthermore, the retaining means can be connected to the actuation portion and/or can be formed integrally with the actuation portion.

It may be desirable for the retaining means to be arranged at one end of the actuation portion of the ejection device, so that the retaining means can be moved directly together with the actuation portion. Thus, when the actuation portion is actuated, the plug-in socket and hence the accommodated component can be released directly.

The retaining means may comprise a catching tab on which the accommodated component engages upon ejection from the plug-in socket, so that the accommodated component will be retained by the retaining means. The retaining means is in particular arranged on an upper side of the electrical component, so that it partially covers the accommodated component in the installed state or active position thereof.

The ejection device can be adapted so as to be at least partially pivotable, and pivoting of the manipulation means may cause the accommodated component to be released or at least partially ejected from the plug-in socket. For example, the actuation portion of the ejection device can be pivoted aside, in a direction away from the plug-in socket, in order to cause the accommodated component to be released or ejected from its active position in the plug-in socket.

The ejection device may also be adapted so as to be displaceable, in particular along an axis parallel to the side walls of the accommodation slot, and so that a displacement of the ejection device causes the accommodated component to be released or at least partially ejected from the plug-in socket.

Interaction of the retaining means with the ejection device is particularly advantageous here, since it makes sense to retain the accommodated component in particular at the moment when the ejection device has been actuated.

Also, when the accommodated component is introduced into the plug-in socket, it can first be placed in the passive position and held there by the retaining means. For example, it is possible in this way to pre-equip electrical components with an accommodated component, for example to pre-equip them for a delivery state in which accommodated components are retained on the electrical components in the passive position, without establishing an electrical connection between the respective accommodated component and the respective electrical component.

When the accommodated component is held on the electrical component in its passive position by the retaining means, it may also be contemplated to transfer the accommodated component into its active position in the plug-in socket by enabling or moving the ejection device in the opposite direction. In other words, in the combined variant with the retaining means, the ejection device can also be adapted to insert the accommodated component into the plug-in socket into the active position thereof.

More particularly, the ejection device is operatively connected to the retaining means in such a way that an actuation of the ejection device causes the retaining means to be automatically provided for the accommodated component. The retaining means can be adapted to hold back the accommodated component when the accommodated component is ejected from the plug-in socket and to transfer it into the passive position. Furthermore, the retaining means may be adapted to receive the accommodated component when the accommodated component is inserted into the plug-in socket and to hold it in the passive position. The retaining means is in particular arranged on the ejection device or is formed integrally with the ejection device.

For example, actuation of the actuation portion will simultaneously also displace the retaining means on the electrical component, so that the plug-in socket is cleared by the retaining means and the accommodated component can be transferred into its passive position.

The retaining means can be mounted resiliently and/or can be designed to be compressible, the retaining means can comprise a buffering element and/or can be configured so as to be U-shaped. The retaining means may also comprise a locking means, and the locking means is in particular arranged on the buffering element.

The ejection device may be adapted so as to extend around the second electrical contacts, i.e. terminals, or around part thereof, in the common contact plane. The ejection portion can be adapted and arranged so as to engage on the accommodated component in the common contact plane in order to eject the accommodated component from the plug-in socket. The ejection device can be arranged entirely in the common contact plane. If the ejection device comprises an actuation portion, the actuation portion can be arranged so as to be covered or countersunk in the housing of the electrical component. The actuation portion of the ejection device may have an actuation head which can be actuated using a hand tool.

The manipulation means may have an encoding such that the manipulation means of a particular electrical component differs from a manipulation means of a further electrical component, for example one that is arranged adjacent to this electrical component. If a plurality of electrical components are arranged next to one another and the manipulation means of each one or of at least some of the electrical components are encoded accordingly, i.e. are designed differently from one another, for example, it will be easier to identify a specific electrical component or the manipulation means of a specific electrical component and to grip it. For example, the encoding of the manipulation means can be achieved by attaching different shapes to the free end thereof, as a grip means. For example, one manipulation means may have a triangular shape as a grip means, another manipulation means may have a square grip means, etc.

The manipulation means may have a tool engagement area to support an actuating tool on the tool engagement area in order to apply a levering force to the actuation portion, and in this case the actuation portion is in particular actuated by a pressure force.

The actuation portion may be designed as a sliding portion which is slidably mounted in an actuation guide and is in particular adapted to perform a vertical movement in the common contact plane when the actuation portion is actuated.

Actuation of the ejection device may cause at least the ejection portion to pivot, in particular the ejection portion and the actuation portion. Alternatively or cumulatively, the ejection portion may form a toggle lever together with the actuation portion.

The actuation guide may have at least one engagement surface for absorbing rotational forces from the tool and/or from the sliding portion and for retaining the sliding portion in the actuation guide. The ejection device may comprise a slide bearing at one end of the ejection portion for slidably supporting the ejection device on the housing of the electrical component.

The ejection device may be formed, e.g. molded, in one piece, and the actuation portion and the ejection portion can be integrally connected to each other.

The actuation portion with the ejection portion can be adapted so as to move parallel to one another in the ejection direction of the accommodated component, when the ejection device is actuated, while the actuation portion and the ejection portion in particular remain arranged in the common contact plane. The ejection device may furthermore be configured so as to pivot around and not interfere with a contact area in which the second electrical contacts or part thereof are arranged in the common contact plane with the ejection device.

The second electrical contact elements of the plug-in socket or at least part thereof can be arranged in a common contact plane in the bottom of the plug-in socket. Accordingly, an imaginary plane or straight line can be spanned through the second electrical contact elements or part thereof.

For example, the contact plane extends along the lateral extension direction of the side walls. The contact plane thus extends at least from the first side wall to the second side wall, typically parallel to the lateral face of the housing of the electrical component. In a side view of the electrical component, the extension direction of the side walls is typically vertically upwards, so that the common contact plane is also a plane that more or less intersects the entire electrical component. In other words, the contact plane intersects the first side wall and the second side wall, for example, and extends at least from the first side wall to the second side wall. The contact plane thus also extends along the lateral extension direction of the side walls, for example, which are typically in the form of shoulders on both sides of the plug-in socket. Alternatively or cumulatively, the contact plane can extend through the accommodated component when it is plugged into the plug-in socket.

Particularly preferably, the common contact plane lies inside the electrical component, so that the common contact plane extends at least through the accommodated component, for example through the middle thereof. In other words, the common contact plane intersects the first and second narrow sides of the electrical component. If the accommodated component is installed, the common contact plane extends through the accommodated component. More preferably, the common contact plane intersects the left and right side walls of the plug-in socket in the middle thereof. The common contact plane extends preferably perpendicular to the main extension direction of the mounting rail when the electrical device is mounted on the mounting rail, and parallel to the opening width of the mounting means of the electrical component for being mounting on the mounting rail.

The actuation portion of the ejection device may be adapted for being actuated using a hand tool. A typical example of such a hand tool would be a flat head screwdriver or a tool specially made for this purpose.

The actuation portion may also be adapted and arranged such that it can only be actuated using a compatible tool. This means that the actuation of the actuation portion with an inappropriate hand tool or manually is prevented or made more difficult, so that, for example, only operators trained or designated for this purpose will be able to actuate the actuation portion. For example, the tool that is also used to connect the cabling may in particular be appropriate or can be adapted for this purpose.

The ejection device furthermore preferably comprises an ejection portion connected to the actuation portion, i.e. an ejector for ejecting the accommodated component from the plug-in socket when the actuation portion is actuated. In other words, the ejection device serves to release and/or at least partially eject the accommodated component from the plug-in socket or from an active position of the accommodated component in the plug-in socket. In other words, the ejection device can be adapted so that in any case the accommodated component is separated from the electrical contacts of the electrical component when the ejection device is actuated. Accordingly, upon actuation, the ejection device will transfer the accommodated component from its active position to a passive position. Here, partial ejection of the accommodated component from an active position is understood to mean that the accommodated component will no longer be fully inserted in the plug-in socket, but will instead only be partly located between the two side walls of the plug-in socket and will partly protrude beyond. In any case, the released or at least partially ejected accommodated component will be electrically separated from the second electrical contacts of the electrical component.

In one embodiment, the ejection portion is adapted and arranged such that it engages on the accommodated component in the common contact plane in order to eject the accommodated component from the plug-in socket. In other words, the ejection portion is mounted so that it extends in the same plane as the second electrical contact elements, i.e. not in front of and not behind the second electrical contact elements when the electrical component is viewed from the side. The arrangement of the ejection portion in the common contact plane has the advantage that the plugged-in component can be ejected from the electrical component without tilting or jamming the accommodated component in the socket. Since tilting of the accommodated component in the plug-in socket is prevented or tilting is largely reduced, less force is required for inserting or removing the accommodated component. Handling of the accommodated component in the plug-in socket is therefore more convenient and simplified. The arrangement of the ejection portion in the common contact plane moreover has the advantage that the overall installation width of the entire electrical component can be further reduced.

The ejection device of the electrical component is in particular formed in one piece, which means that the entire ejection device is connected to one another.

The ejection device is preferably configured so as to extend around a part of or around all of the second electrical contact elements of the electrical component in the common contact plane. In other words, when viewed in a side view from the narrow side, the ejection device is arranged in a line of the contacts, i.e. terminals, in the contact plane.

Preferably, the ejection device is entirely arranged in the common contact plane, i.e. with all of its constituents such as in particular the actuation portion and the ejection portion.

In an illustrative embodiment, the ejection device is designed to comprise a rotary axis, pivot, pivot axis, or a semi-circular engagement surface.

The actuation portion of the ejection device is preferably arranged in a concealed or countersunk manner in the housing of the electrical component. Such a concealed or countersunk installation allows to prevent a possible incorrect actuation of the ejection device due to unintentional actuation while handling the electrical components. Rather, in the case of a concealed or countersunk ejection device, the actuation portion will only be actuated when this is intended.

The actuation portion of the ejection device may have an actuation head which can be actuated using a hand tool. Such an actuation head may, for example, have a notch or other tool recess which can be actuated particularly easily with the hand tool without the hand tool slipping off the actuation head during the actuation.

The electrical component preferably has a tool engagement area for supporting the actuation tool for exerting a levering force on the actuation portion. In other words, a portion close to the actuation portion is formed such that a hand tool can be supported there to apply leverage with the hand tool against the tool engagement area so as to make it easier to actuate the ejection device.

The actuation portion is therefore in particular actuated by applying a pressure force. Accordingly, a pressure is exerted on the actuation portion in order to cause the ejection of the accommodated component. It has been found that a more elegant and more effortless actuation of the ejection device can be effected with a pressure force or a combination of a pressing and levering effect, in particular in combination with the tool engagement area, in comparison to applying a pulling force. It has thus been found that when space is limited it is also easier and more effortless to exert a pressure force, optionally a combination of a pressing and levering force, on the actuation portion when installing or removing an accommodated component in or out of the electrical device. In other words, the actuation portion can be arranged such that it is impossible to actuate it with a pulling force. For example, the levering actuation of the actuation portion by means of the tool also provides for an almost or completely concealed installation of the actuation portion, which can then only be reached with the respective appropriate tool. In this way, safety is further increased, since the actuation portion can no longer be triggered unintentionally or unintentional actuation will be significantly more difficult.

The actuation portion may be configured as a sliding portion or slider which is slidably accommodated in an actuation guide. The sliding portion may further be adapted to perform a vertical movement in the common contact plane when the actuation portion is actuated. In this embodiment, the sliding portion will therefore be arranged in the common contact plane together with the second electrical contacts. The actuation guide may furthermore have an engagement surface for absorbing rotational forces from the tool and/or the sliding portion. Furthermore, the engagement surface may be adapted to hold the sliding portion in the actuation guide.

The electrical component may have a separating means to improve the electrical insulation between a first part and a second part of the second electrical contact elements. In other words, an electrical separation or insulation may be installed inside the electrical component, which better insulates one part of the electrical terminals from a second part of the electrical terminals. In this way, the installation space required for the electrical terminals can be reduced further, since it is thus possible to further reduce the insulating distances between the first part and the second part of the electrical terminals.

The first part of the electrical contact elements may be adapted to transfer relay control. The second part of the electrical contact elements may transfer the output signals.

The ejection device of the electrical component may comprise a slide bearing at one end of the ejection portion for slidingly supporting the ejection device on the housing of the electrical component. In other words, the ejection portion may be slidably received in a sleeve, for example, or in another type of bearing, in order to enable a pushing or pulling movement of the ejection portion relative to the actuation portion and/or relative to the accommodated component.

The ejection device may furthermore have at least one living hinge for coupling the actuation portion to the ejection portion. Such a living hinge mechanically connects the actuation portion to the ejection portion, so that the ejection device having at least one living hinge is described as being formed in one piece, i.e. integrally.

The ejection device may also be formed, i.e. for example molded, integrally in one piece, with the actuation portion and the ejection portion integrally connected to one another. In this case, the ejection device is preferably made of an electrically poorly conductive material such as plastics material.

The actuation portion and the ejection portion are designed so as to move together, parallel to one another in the ejection direction of the accommodated component, when the ejection device is actuated. The actuation portion and the ejection portion remain located in the common contact plane during the ejection movement.

The ejection device may be shaped so as to pivot around and not interfere with a contact area. The contact area can be distinguished by including the second electrical contacts arranged in the common contact plane with the ejection device. In other words, a defined contact area can be kept clear of the ejection device during actuation thereof, that is to say the latter will preferably pivot therearound, so that the terminals arranged in the contact area are not touched by the ejection device even during movement thereof.

The present disclosure furthermore encompasses an assembly comprising an electrical component, in particular as described above, and an accommodated component plugged into the plug-in socket of the electrical component. The assembly comprises a manipulation means, in particular as described above, by means of which the accommodated component can be inserted into the plug-in socket or pulled out of the plug-in socket.

One observation that was made within the context of the present description is that, for example, installers keep inserting components to be accommodated into the accommodation slot in an incorrect orientation, thereby causing electrical contacts to be bent or even destroyed. In this case, short circuits may be caused, or total failure of at least the accommodated component. In the field of large-scale industry, it can happen that a replacement is not immediately followed by a check of each individual relay and that a defective relay is replaced by a relay that is again defective, thus introducing errors that might be difficult to detect. This often results in time-consuming troubleshooting, possibly leading to a failure of the technical system as a whole. Thus, the inventors have realized that a solution is being sought such that, if the component to be accommodated is mistakenly attempted to be mounted in the wrong orientation, no mechanical stress can occur on the electrical terminals of the accommodated component, so that deformation of the male electrical terminals can be avoided.

For preventing this, it has been realized that the accommodated component can be encoded for the correct orientation such that incorrect installation will be prevented from the very beginning. For this purpose, a component to be accommodated can be provided which is adapted for being mounted in a plug-in socket, in particular a terminal block. The component to be accommodated is in particular a relay.

The component to be accommodated can comprise a component housing for accommodating a functional device in the component to be accommodated. Such a functional device can comprise a circuit structure for a relay or an optocoupler, for example, or any other electrical or electromechanical structure for a component to be accommodated. The component housing furthermore comprises first and second narrow sides opposite to one another, and two opposite flat sides or faces.

Each of the pair of narrow sides and the pair of flat sides are in particular arranged opposite to one another, so that a flat side successively alternates with a narrow side, with the narrow sides extending perpendicular to the flat sides. In other words, when viewed from above, the component housing typically defines a substantially rectangular, quasi-rectangular, or close to rectangular outline. Electrical components, i.e. the “carrier elements” for the component to be accommodated, are lined up next to one another in the direction perpendicular to the flat sides. Accordingly, the accommodated components can also be lined up with their flat sides facing one another, for example when mounted on a mounting rail.

Electrical contacts may be provided on the underside of the housing for a mateable electrical connection to electrical contacts of the plug-in socket. A guide feature is provided on at least one of the two narrow sides. The guide feature is adapted for ensuring correct orientation of the accommodated component along the guide feature into the plug-in socket. In other words, the guide feature is adapted and/or shaped such that when the component to be accommodated is inserted into the plug-in socket, insertion will only be possible in the correct orientation, whereas the guide feature prohibits insertion when insertion is attempted with the wrong orientation. Thus, the guide feature is designed so as to block or prevent insertion of the component to be accommodated in an incorrect or unintended installation orientation.

For this purpose, the guide feature is only arranged on one of the two narrow sides, for example, or a guide feature is provided on at least one of the two narrow sides. In any case, the structure of the guide feature is adapted in such a way that the guide feature on the first narrow side of the component housing differs in its structure from the structure on the second narrow side of the component housing. This only allows insertion of the component to be accommodated into the plug-in socket in a predetermined orientation, and insertion in a different orientation is blocked by the guide feature. In other words, the component to be accommodated is mechanically encoded by the guide feature.

In other words, the guide feature may comprise guiding means provided on the accommodated component and optionally on the plug-in socket, which provide for a translational, preferably rectilinear directed guidance of the accommodated component. The guiding means are designed so as to simplify insertion of the component to be accommodated and to make incorrect installation more difficult.

In terms of the guide features, the accommodated component may, for example, have at least one rib that is adapted for engaging in a groove in the plug-in socket. Also, the guide features can be designed so as to comprise at least one groove into which a rib of the plug-in socket engages when the accommodated component is installed in or is being inserted into the plug-in socket in the correct orientation. Furthermore, the guide features may comprise at least one groove on the first narrow side of the accommodated component, and the guide features on the second narrow side may comprise at least one rib.

In other words, the narrow side of the accommodated component has a guide portion which, upon installation on the plug-in socket, interacts with a mating guide portion provided on the plug-in socket and formed complementarily thereto, at least in part, for translational guidance. Hence, the guide features in particular comprise not only the guiding means of the accommodated component, but also the interaction thereof with the plug-in socket and the complementary mating guide of the plug-in socket, which interacts with the guiding means of the accommodated component.

In order to ensure installation of the component to be accommodated in the plug-in socket with correct orientation, the guide features may comprise at least one stop. For example, in the case that the guide feature comprises ribs, these ribs may have different lengths. Only the correct orientation or alignment of the accommodated component in the plug-in socket will then allow the accommodated component to be completely introduced into the plug-in socket. With this arrangement, the shape of the guide features or of the guiding means may, for example, be the same on the two narrow sides, at least in portions thereof, and in particular their arrangement may differ.

Furthermore, such stops may also be provided in grooves in order to provide an "encoding" for the installation orientation of the accommodated component in the plug-in socket.

The rib of the guiding means may be in the form of one or more ribs, projections, or fins, for example. In principle, "mechanical encoding" is also possible using a knob design. For the purposes of the present application, such knobs are also regarded as ribs, since the narrow sides thereof will slide along the guiding portions when the accommodated component is introduced into the plug-in socket.

What is therefore explained here is that mechanical encoding of the accommodated component is achieved by appropriately designing the outer shape of the accommodated component such that such encoding is provided. In addition to the aforementioned examples, this can also be achieved with a trapezoidal shape having inclined sides with a different angle on the respective narrow sides of the accommodated component. In this case, mating with the plug-in socket would be prevented in case of misalignment. All these and technically similar configurations of the guide features or guiding means shall be encompassed here accordingly, as they have the same technical effect in order to achieve the goal of preventing incorrect installation of the accommodated component in the plug-in socket.

Preferably, the guide feature on the first narrow side of the component housing may comprise a structure with a different width or thickness compared to the structure on the second narrow side, for example by having a wider groove or a rib of greater width provided on the first narrow side in comparison on the second narrow side.

The electrical contacts or terminals provided on the underside of the component housing typically protrude downwards, out of the component housing. These downward protruding electrical terminals of the component housing can be plugged into female terminals of the plug-in socket if the accommodated component is inserted into the slot or plug-in socket in the correct orientation.

The electrical terminals arranged on the underside of the component housing can comprise at least a first, a second, and a last electrical terminal, which are arranged at a distance from one another. The first electrical terminal may be located at a first distance from the first narrow side. Furthermore, the last electrical terminal may be located at a second distance from the second narrow side. Preferably, the first distance is different from the second distance, and/or the distances between the electrical terminals are different.

If the distance between the electrical contacts is different or the first distance differs from the second distance, the relay can only be introduced into the female terminals of the plug-in socket in a single correct orientation. In the past, it could happen that if the accommodated component was attempted to be installed incorrectly, the male terminals were damaged or bent upon installation. On the other hand, it used to be an important feature in the past to provide the electrical terminals at different distances to one another, since this provides information about the correct installation of the accommodated component. When using the guide features presently proposed it is now even possible for the terminals to be arranged symmetrically and to even use more electrical terminals than was previously possible. The definition of alignment or orientation for the installation of the accommodated component in the plug-in socket is now no longer given or no longer mandatory through the arrangement of the electrical terminals, since it can now be provided through the guide features according to the present disclosure.

In a further embodiment, the accommodated component may be adapted to be arranged in the plug-in socket of a terminal block. The terminal block with plug-in socket can now have an installation width of less than 6 mm.

A further aspect is to provide a predefined retaining position, for example during transport or for a controlled separation of an accommodated component from its plug-in socket. The accommodated component can then be held in a parking position of the guide features, in particular the plug-in socket and the guide features can be locked there, so that the electrical connection between the accommodated component and the plug-in socket is reliably interrupted.

The guide features of the accommodated component may comprise at least one latching lug or latching recess, which can be designed to be mateable with a latching recess or latching lug of the plug-in socket. The latching lug or latching recess of the guide feature can be arranged such that the accommodated component remains locked in the parking position when the latching lug or latching recess of the guide feature interacts with the latching recess or latching lug of the plug-in socket.

The present disclosure will now be explained in more detail by way of illustrative embodiments and with reference to the figures, in which identical and similar elements are partially denoted by the same reference numerals, while the features of the various exemplary embodiments can be combined with one another.

BRIEF DESCRIPTION OF THE DRAWINGS

In the Drawings i:

FIG. 14 shows a further embodiment of the present disclosure on an accommodated component;

FIGS. 15*a-d* show alternative embodiments of manipulation means;

DETAILED DESCRIPTION

Figure 1:
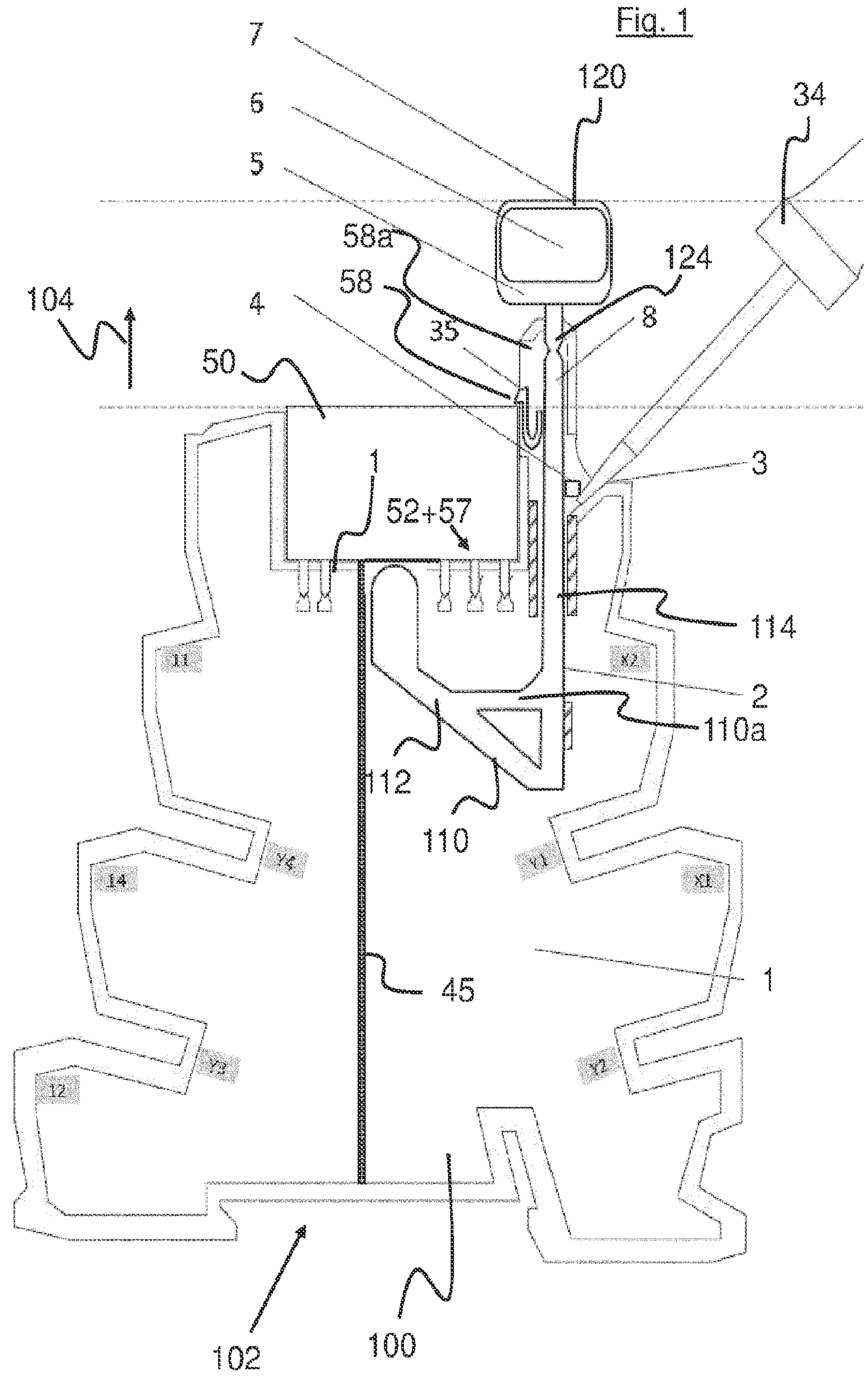
FIG. 1 shows a first embodiment of the present disclosure.

FIG. 1 shows an embodiment of the present disclosure with a manipulation means that is arranged on the upper side of the electrical component 100. The electrical component 100 comprises an ejection device 110 with an actuation portion 28 and an ejection portion 112. The manipulation means 120 is provided on or attached to one end of the actuation portion 28. The manipulation means has an actuation portion on its upper end, which is provided as a deformation portion 7. The manipulation means furthermore has an inner opening 6 for easily introducing the fingers order to grip and pull on the manipulation means 120. The accommodated component 50 is placed in the accommodation slot 1. It is retained in the accommodation slot 1 by a wall 35 that comprises a retaining lug 58 which protrudes over the accommodated component 50. Retaining lug 58 can also be used to transfer a pressure force exerted from above by the ejection device 110 to the accommodated component 50, for example when the manipulation means 120 is actuated from above on the deformation portion 7. The retaining lug is flexibly coupled to the actuation portion 28, to increase comfort. Thus, the manipulation means 120 can be used to press or insert the accommodated component 50 into the active position in the accommodation slot 1 as well as to press the accommodated component 50 out of the accommodation slot by exerting a pulling force on the manipulation means 120. The manipulation means 120 is flexibly or pivotably coupled to the actuation portion 28 through a pivot 124, so that the deformation portion 7 can be pulled in different directions and, nevertheless, a linear movement of the ejection device 110 will be ensured.

The accommodated component 50 is fully installed in the plug-in socket 1, in its active position, such that the first electrical contacts 52 of the accommodated component are engaged in the second electrical contacts 57 of the electrical component. More particularly, the first electrical contacts 52 are pin terminals, and the second electrical contacts 57 are female terminals. This allows an additional holding force to be exerted on the accommodated component 50 in the plug-in socket 1 due to the electrical connection, i.e. the insertion of the pins into the female terminals, so that the accommodated component 50 is retained in the active position. This is promoted by the detent or retaining lug 58. If, now, the manipulation means 120 is pulled, or, as an alternative in this embodiment, a tool 34 is used to perform a corresponding levering movement on the tool engagement area 4 of the ejection device 110, an ejection force will be exerted on the accommodated component 50 by the ejection lever 112 from underneath the accommodated component 50, so that the accommodated component 50 will leave the active position in the accommodation slot 1 in an upward direction in the plane of the drawing. Typically, this upward direction corresponds to a direction away from the mounting means 102 of the electrical component 100, by which the electrical component is typically latched onto a mounting rail such as a top hat rail.

The retaining lug 58 which secures the accommodated component 50 on the upper side of the accommodated component 50 will move along in the ejection direction 104, so that the accommodated component 50 remains engaged on the retaining lug 58 during the ejection process.

In a particularly preferred embodiment, a stop **58*a* is furthermore provided for the retaining lug 58, against which the retaining lug comes to rest during the ejection process, so that the accommodated component is still retained by the retaining lug 58 in this position. This prevents the accommodated component from being ejected abruptly and allows the accommodating component to be parked in a parking position. This may be desirable, since in this parked position the accommodated component 50 cannot suddenly jump out of the accommodation slot and, on the other hand, it can be stored in the parked position for subsequent use. The parking position for the accommodated component 50 is supported or ensured by the ejection portion 112 below the accommodated component 50 on the one hand, and by the retaining lug 58 on the upper side of the accommodated component 50**.

Figure 2:
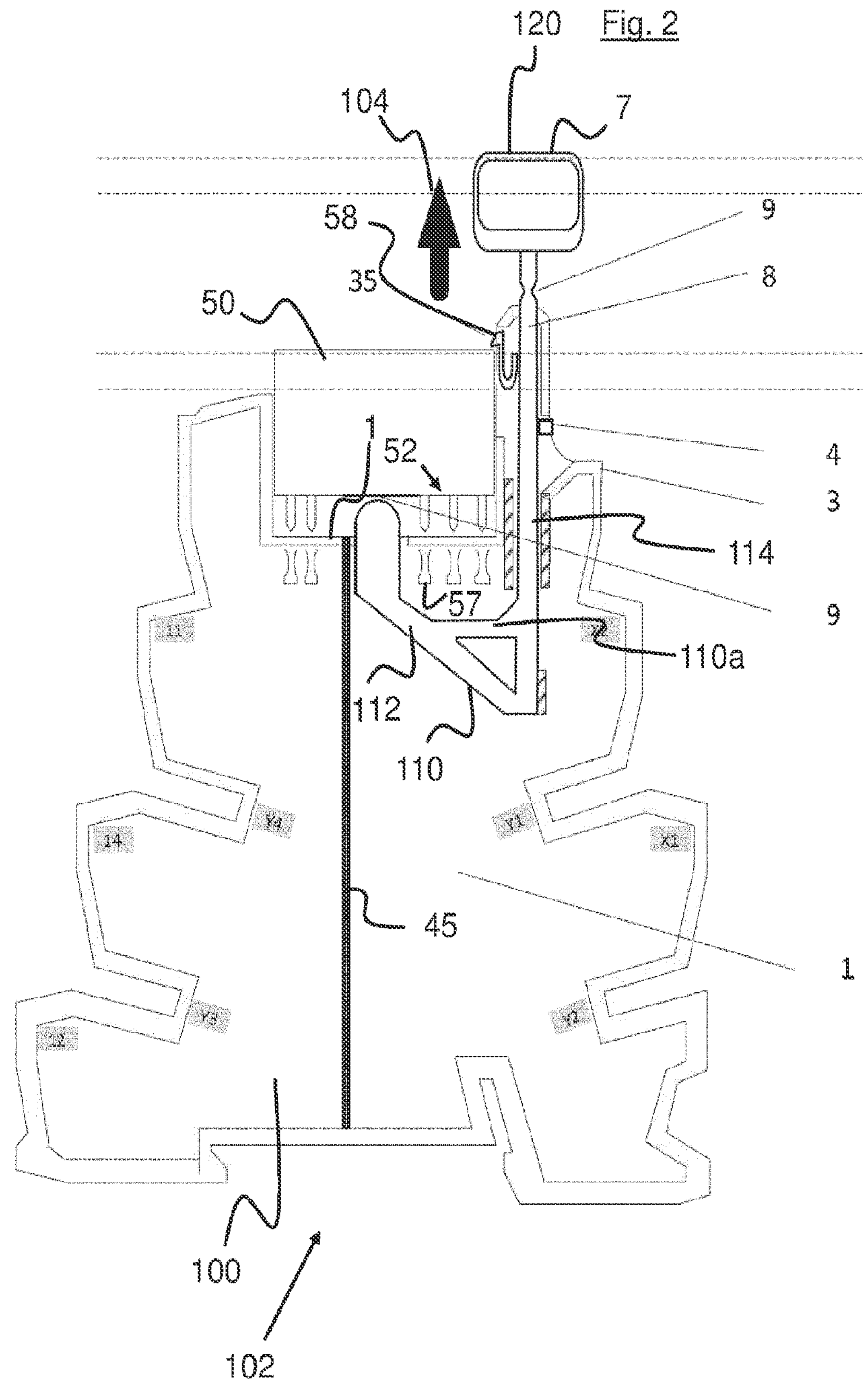
FIG. 2 shows the embodiment of FIG. 1 with a partially disengaged accommodated component or with the accommodated component in a passive position.

FIG. 2 shows the electrical component 100 with the accommodated component 50 in a parking position, with the electrical contacts 52 of the accommodated component reliable and sustainably disconnected from the second electrical contacts 57 of the electrical component 100. In other words, the first electrical contacts 52 are held spaced apart from the second electrical contacts 57, so that there is no electrical connection, and the accommodated component 50 is held in this position by the ejection portion 112 and the retaining lug 58 such that a shift in position or a change in position without external impact is prevented. If it is desired to completely remove the accommodated component 50, the retaining lug 58 can be pushed aside, for example, for instance by a tool, and the accommodated component 50 can then be removed from accommodation slot 1 upwards, in the ejection direction 104.

The manipulation means 120 can also be used to reinserted the accommodated component 50 into the active position in the accommodation slot 1. For this purpose, pressure can be exerted onto the resilient portion 7 on the upper side of the manipulation means, whereby the ejection device 110 will be pushed inwards.

Figures 3, 4:
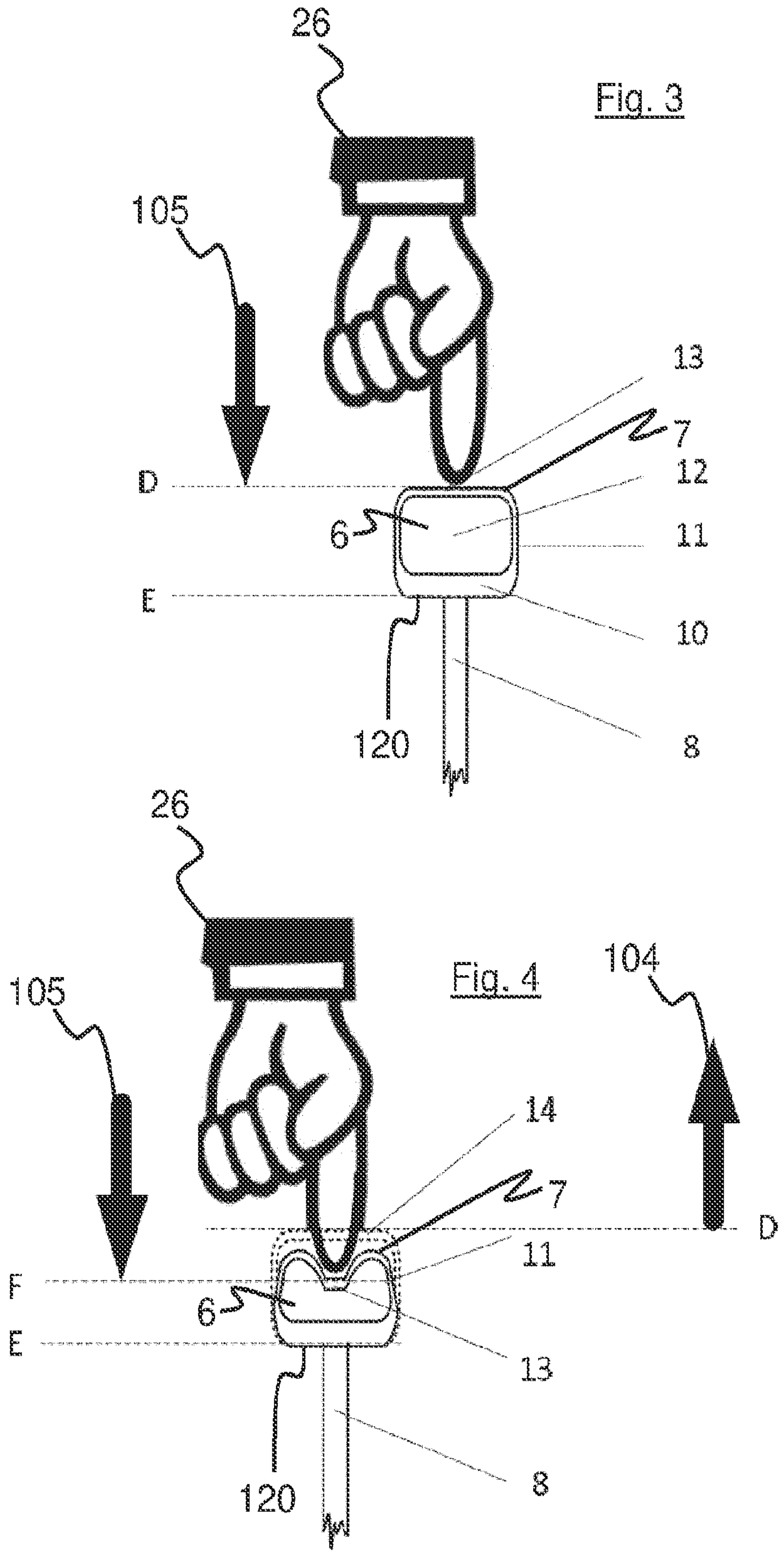
FIG. 3 shows a detail of the manipulation means with indication of the direction of actuation.
FIG. 4 shows a further detailed view of a manipulation means while being actuated.

FIGS. 3 and 4 show a detail of the manipulation means 120, illustrating the actuation by a user 26. Referring to FIG. 3, the manipulation means 120 is shown in its non-deformed state, and the user 26 starts to exert a force in the direction of the insertion direction 105, by pressing onto the pressure point 13 of the deformable portion 7, so that the inner opening 6 of the manipulation means 120 begins to deform or becomes smaller. Through crossbar 10, the force is further transferred to a push and pull rod 8. Referring to FIG. 4, the user 26 presses on the deformable portion 7 of the manipulation means 120 which is pressed inwards towards the inner opening 6. A resilient portion 11 can also be provided laterally around the inner opening 6 in order to ensure flexibility of the manipulation means and thus comfortable actuation thereof. Ideally, the user 26 presses the pressure point down, towards the electrical component 100, so that the force is transferred along push and pull rod 8. The resilient portion 7 will deform from initial position D to the depressed position F.

Figure 5:
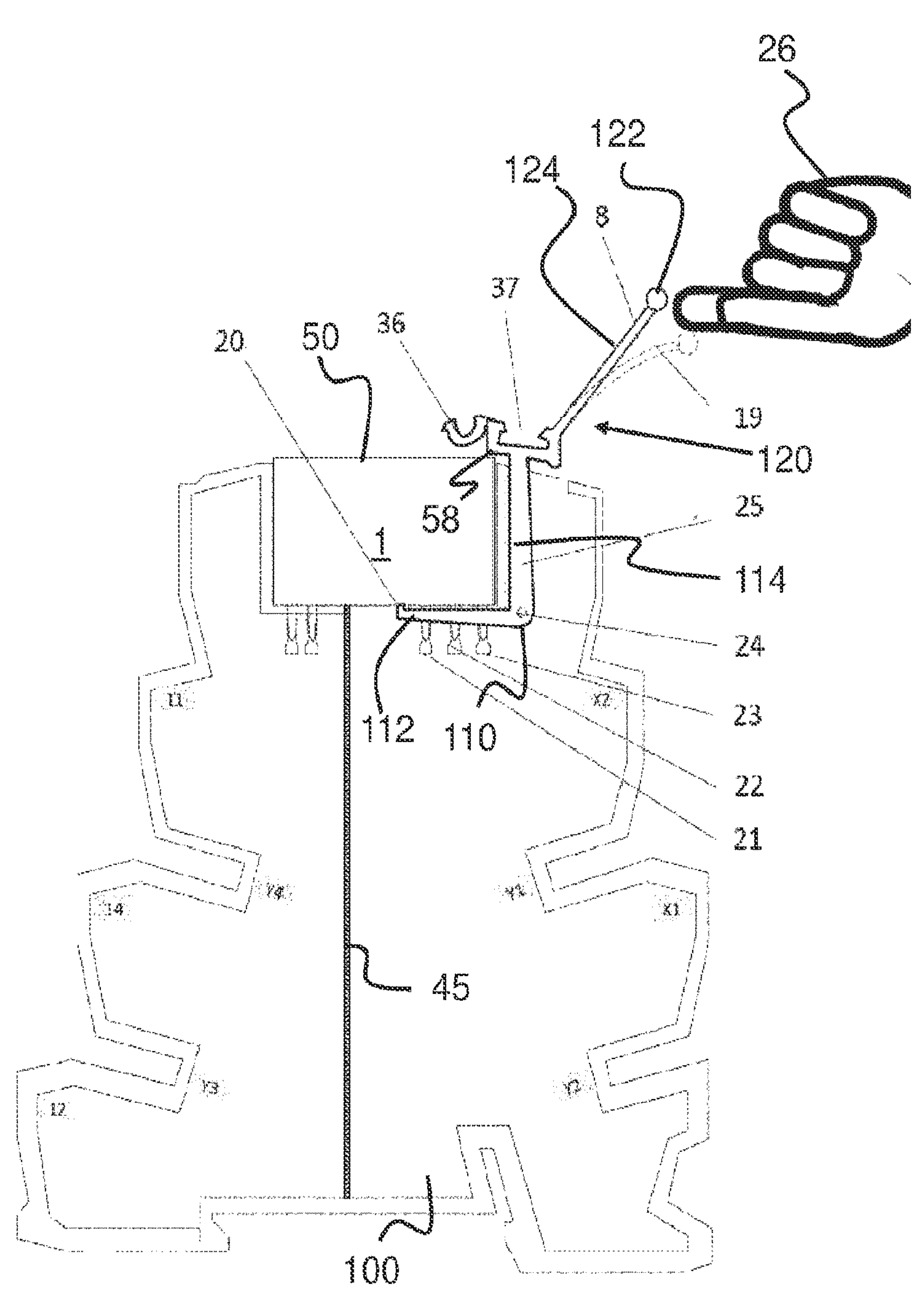
FIG. 5 shows a further embodiment of the present disclosure.

Referring to FIG. 5, a further embodiment of the present disclosure with a manipulation means 120 is shown. This embodiment is particularly suitable in the case where it is easier to reach the electrical components 100 from a lateral side, so that less space is required above the installation space for the electrical components 100 to access the upper side of the electrical components 100 for installing or extracting accommodated components 50. The electrical component 100 comprises an ejection device 110 which is adapted for being pivoted sideways. An actuation portion 28 is formed integrally with the ejection portion 112. In this case, manipulation means 120 is provided flexibly at the free end of actuation portion 28. Spacing portion 124 can be rigid. Spacing portion 124 can be in the form of a lever, or rod-shaped, or can define an integrally formed cantilever arm. At the free end of spacing portion 124, a grip means 122 is provided, which can be gripped particularly well and easily by the user 26.

The spacing portion 124 can be designed differently from one electrical component 100 to the adjacent electrical component 100', in particular in an alternating manner between the electrical components 100 relative to one another, for example with different angles relative to one another, or the like. This also corresponds to a type of encoding and provides improved gripability, or improved recognizability as to which spacing portion 124 has to be gripped in order to actuate the intended accommodated component 50.

The grip means 122 may also be adapted for being gripped using a tool that is specifically designed for this purpose. In the example of FIG. 5, the accommodated component 50 is installed in the active position in the plug-in socket 1 of the electrical component 100. It is held in its active position by a tab 36 and by retaining lug 58 of the ejection device 110. A neighboring pull rod 19 is shown in phantom to illustrated that the spacing portion 124 of the manipulation means 120 can be selected by sliding one's finger over the plurality of adjacent coupling rods 19, 124, . . . thereby pushing away or deflecting the adjacent coupling rods to clear the manipulation means 120 to be gripped, so that it can be easily selected and gripped. If, now, the user 26 pulls on the manipulation means 120, in particular on grip means 122, the ejection device 110 will be actuated so that the accommodated component 50 is at least partially ejected from the accommodation slot 1. For example, the accommodated component 50 is transferred from its active position into a passive position, if the accommodated component 50 can be held in the electrical component 100 accordingly.

Figure 6:
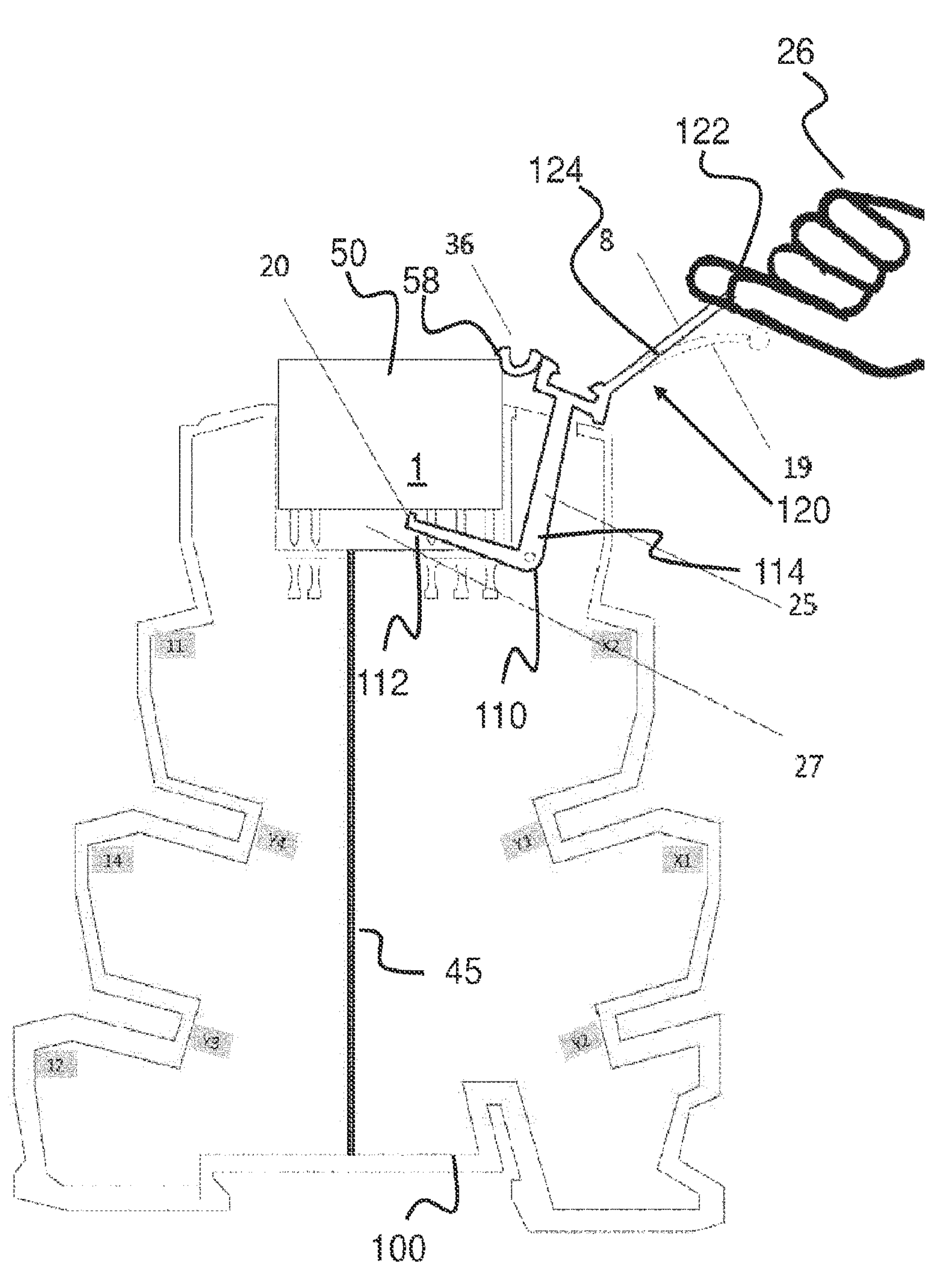
FIG. 6 shows the embodiment of FIG. 5 with the manipulation means actuated.

Referring to FIG. 6, the accommodated component is shown in its passive position on the electrical component 100, and this passive position is provided by the ejection portion 112 of ejection means 110 on one side and by retaining tab 58 on the other side. In other words, the accommodated component 50 is clamped between the end portion 20 of ejection portion 112 and the retaining lug 58 and is thus retained in the passive position.

Figure 7:
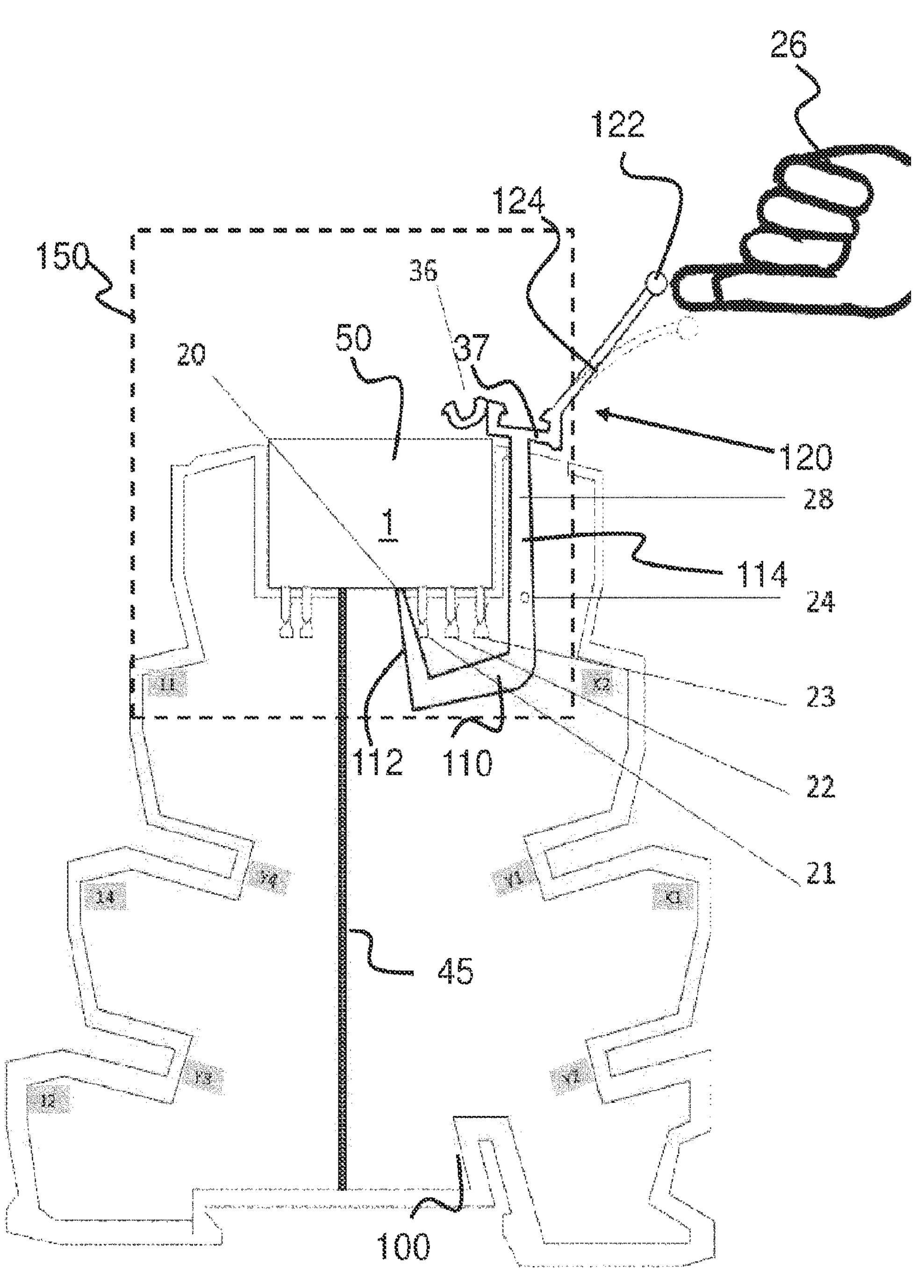
FIG. 7 shows yet another embodiment of the present disclosure, suitable for particularly narrow structures.

Referring to FIG. 7 which shows a further embodiment of the present disclosure, comprising a manipulation means 120 which, in this case, is particularly suitable for very narrow electrical components 100, for example with a width of 3 mm. The ejection device 110 provides a pivoting range around the second electrical contacts 21, 22, 23, such that the second electrical contacts 21, 22, 23 are kept clear of the ejection device 110. This has the advantage that the ejection device 110 can be arranged in a common contact plane 150 together with the second electrical contacts 21, 22, 23. In this way, installation width can be reduced, since the ejection device 110 is now not arranged laterally of the second electrical contacts 21, 22, 23, but below them. The ejection device 110 pivots about a pivot 24. A tab 36 is provided on the upper end of the ejection device 110, which protrudes beyond the rest of the electrical component 100, and this tab 36 is capable of providing a parking position for the accommodated component 50 during an ejection process or during an insertion process of an accommodated component 50 into the accommodation slot 1.

Figure 8:
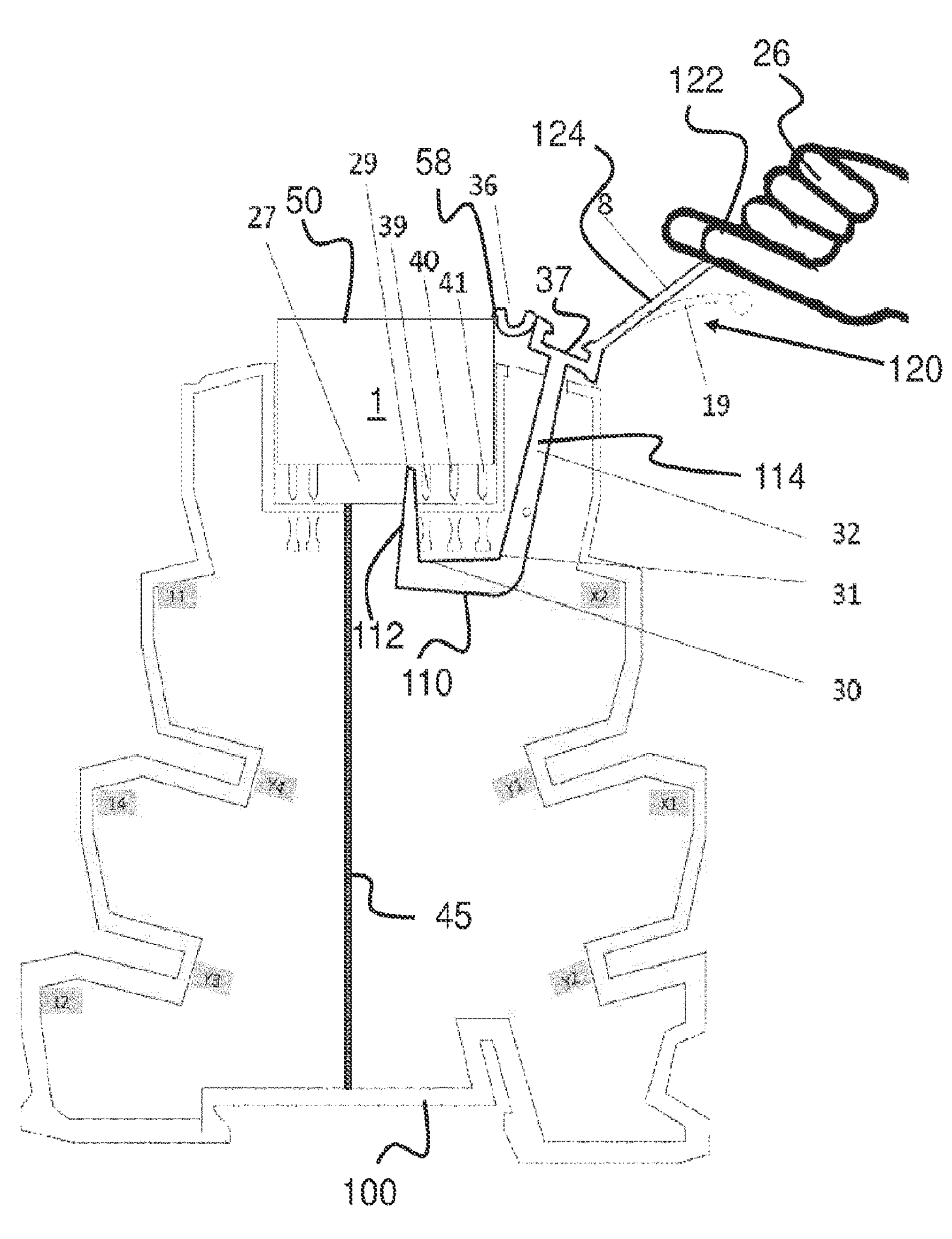
FIG. 8 is a view of the embodiment of FIG. 7 while being actuated.

Referring to FIG. 8, which illustrates how the manipulation means 120 is gripped and actuated by a user 26. The user 26 grips the grip means 122 with two fingers on the free end of spacing portion 124. The accommodated component 50 is held in the parking position by the ejection device 110, with the retaining lug 58 at the upper side ensuring countersupport for the accommodated component. The electrical contacts 39, 40, 41 of the accommodated component 50 are electrically disconnected from the electrical component 100 in this passive position.

In order to provide the pivoting area for the ejection device 110, which does not interfere with the second electrical contacts 21, 22, 23, the ejection portion 112 has a first deflection 30 and a second deflection 31. The accommodated component 50 is ejected at the pressure point 29 of ejection portion 112. Thereby, a free space 27 is created below the electrical component 50, for electrically and mechanically separating the accommodated component 50 from the electrical component 100.

Figures 9, 10:
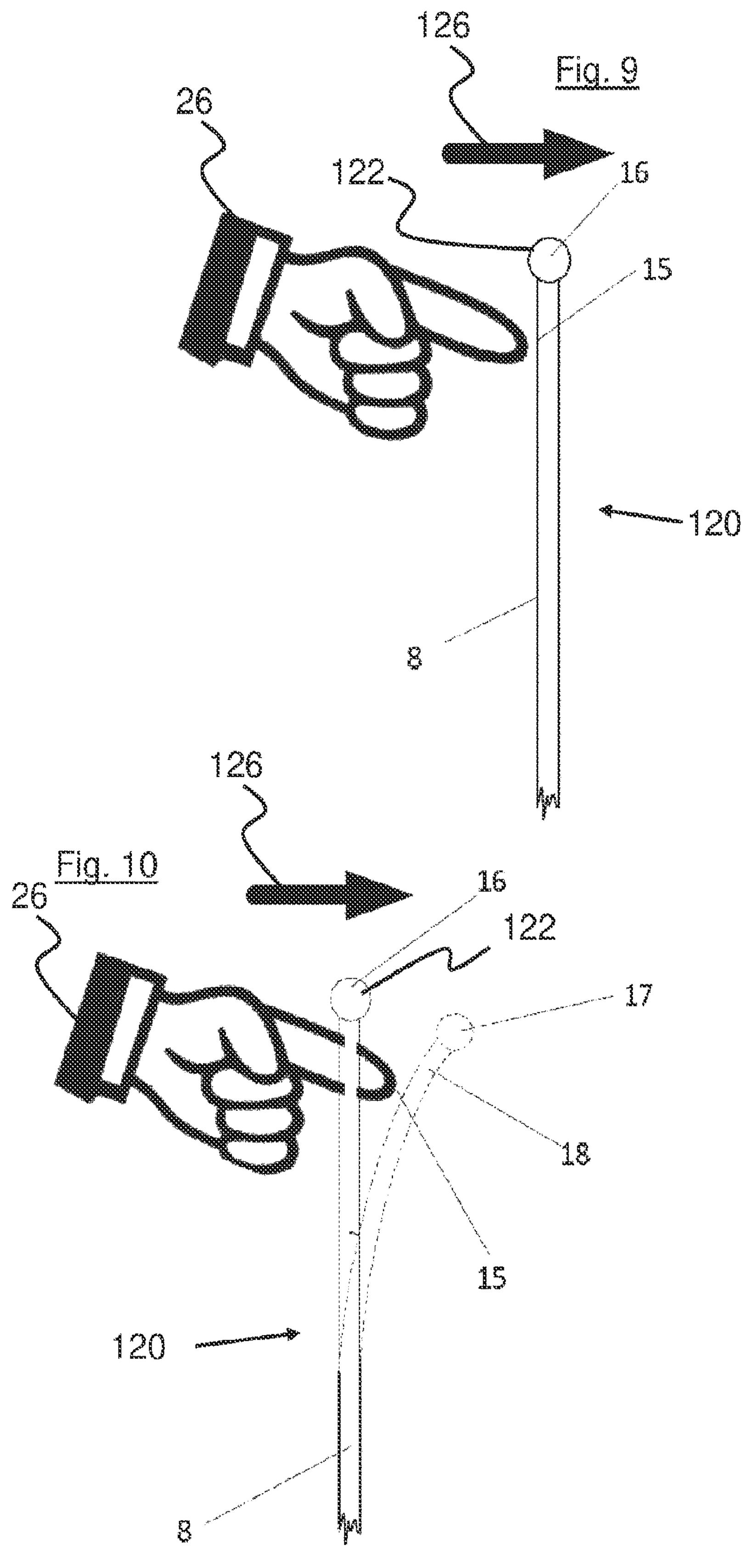
FIG. 9 shows a detail of a manipulation means.
FIG. 10 shows a detail of the manipulation means of FIG. 9 during actuation.
Figure 11:
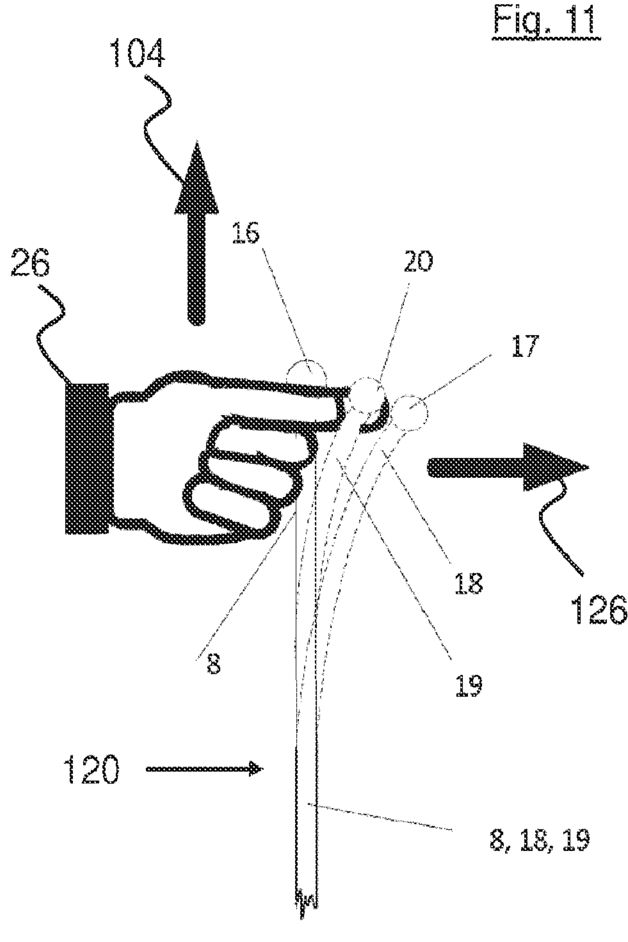
FIG. 11 is a further detailed view of the manipulation means.

Referring to FIGS. 9 to 11, which illustrate how the user 26 can select a manipulation means 120 in order to then actuate it. First, the user 26 presses the spacing portion 8 aside, in the direction of deflection arrow 126, at pressure point 15. For example, if the user 26 ultimately wants to grasp grip means 16, he or she pushes aside the neighboring manipulation means 17, . . . , as shown in FIG. 10. Once the neighboring manipulation means 17, 18 have been pushed aside at pressure point 15, the manipulation means 120 remains clear and straight, so that it can now be easily grasped, as illustrated in FIG. 11. According to FIG. 11, the pull rod 8 can now be grasped and, depending on the embodiment, displaced in the pull-out direction 104 of the accommodated component or in the deflection direction 126, if this is easier.

Figure 12:
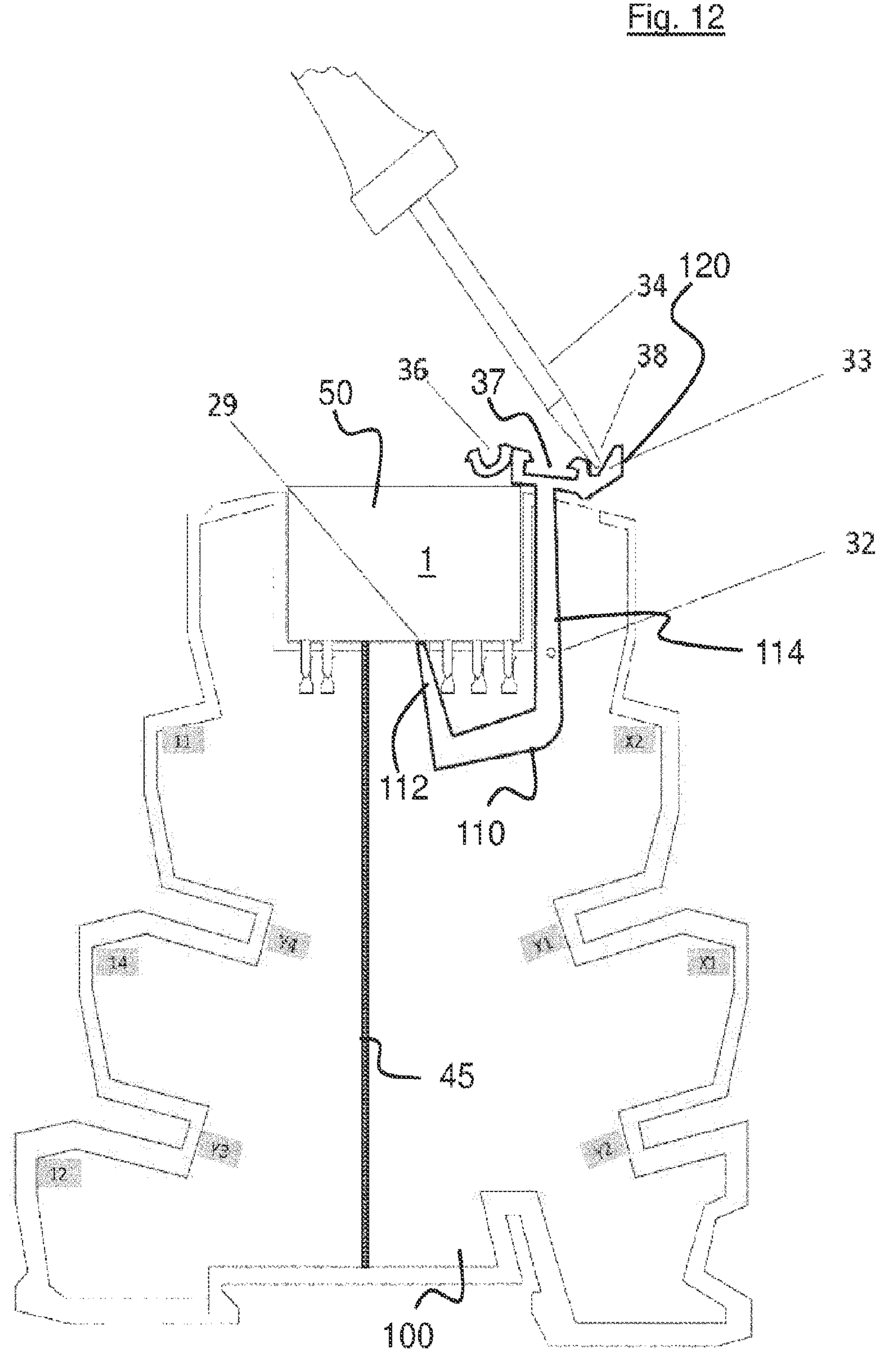
FIG. 12 shows a further embodiment of the present disclosure, particularly suitable for being actuated by a tool.

Referring to FIG. 12 which shows an alternative embodiment that is optimized for being actuated using a hand tool 34. In this case, the manipulation means 120 has a pocket 38 into which the hand tool 34 can be introduced in order to manipulate the actuation portion 28. Pocket 38 prevents the tool 34 from slipping out, thereby reducing the risk of being scratched or injured by the blade of the hand tool 34. This embodiment also has a groove 37 for receiving an inscription label on the electrical component 100.

Figure 13:
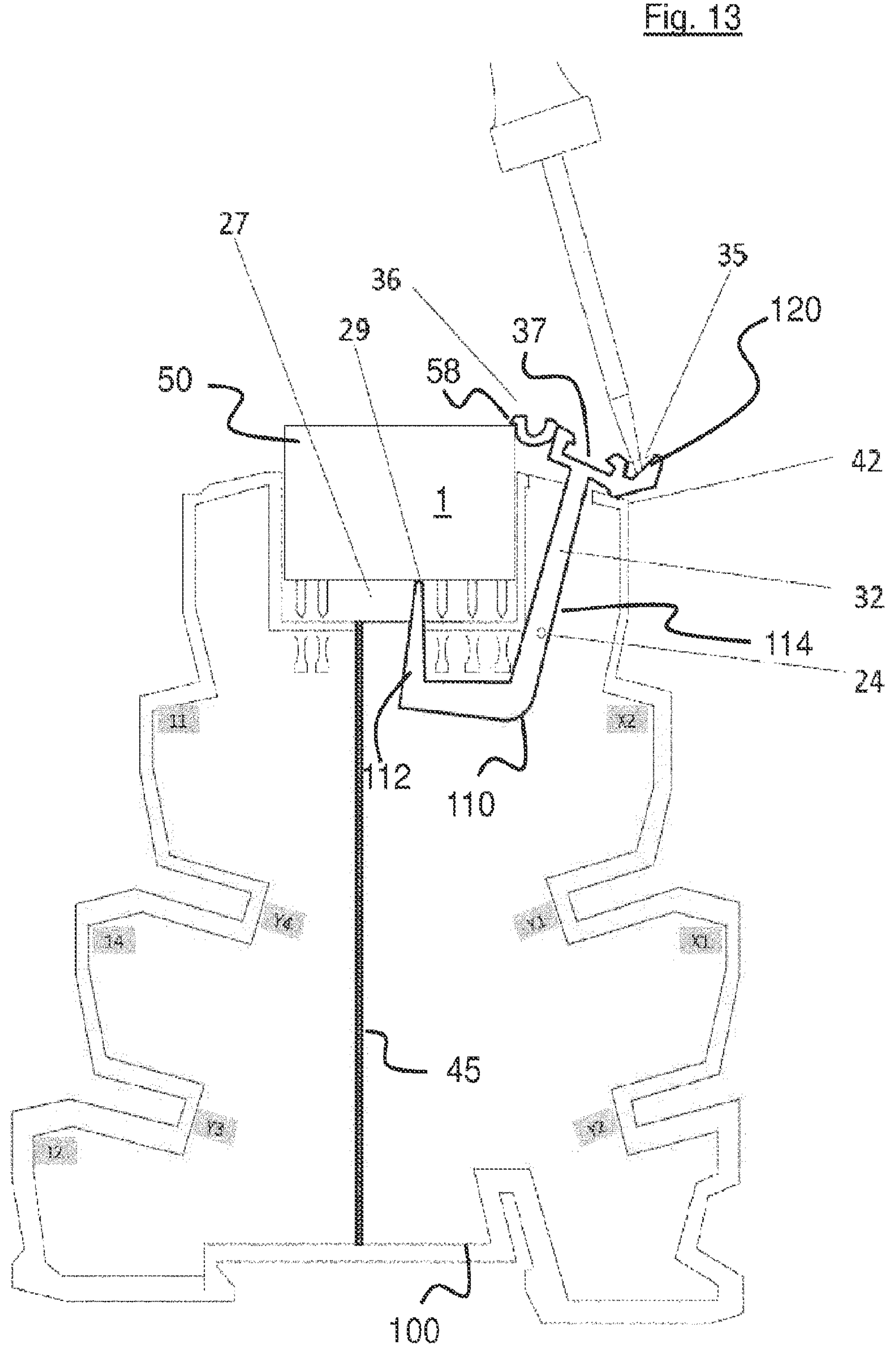
FIG. 13 shows the embodiment of FIG. 12 after having been actuated.

FIG. 13 shows the actuated manipulation means 120 for this case, with the accommodated component 50 transferred into and assuming the passive position on the electrical component 100 as a result of this actuation. The accommodated component 50 is held in this passive position by holding lug 58 and pressure point 29. The electrical contacts of the accommodated component are reliably separated, i.e. disengaged, electrically and mechanically, from the electrical contacts of the electrical component 100.

Referring to FIG. 14 which shows yet another embodiment of the present disclosure, with the manipulation device 120 provided on an upper side of the receiving component 50 for insertion into a slot 1. A user 26 depresses the resilient tab 7 so that the inner opening area 6 is reduced and a flexible, elastic pressure force is exerted onto the accommodated component 50, through which the accommodated component can be pressed into the plug-in socket. On the other hand, the user 26 can also grasp the accommodated component 50 on the protruding manipulation means 120 in order to pull it out of the plug-in socket 1.

FIGS. 15*a*, 15*b*, 15*c*, and 15*d* show different design variants of tab 7 of the manipulation means 120 on the upper side of the accommodated component 50. For example, FIG. 15*a* shows the embodiment of an annular tab, which in particular is a resilient annular tab. FIG. 15*b* shows an embodiment with a spacing portion 124, which allows the manipulation means 120 as a whole to protrude further or higher beyond the accommodated component 50. FIG. 15*c* shows the manipulation means in the form of a T-bar, so that a tool can be placed below the grip means 122 or the user 26 can grasp the grip means 122 with the fingers. Finally, FIG. 15*d* shows the manipulation means 120 in the form of a hollow or depression into which the fingertip or a tool can be introduced, for example, in order to press the accommodated component 50 into a plug-in socket 1.

Figure 16:
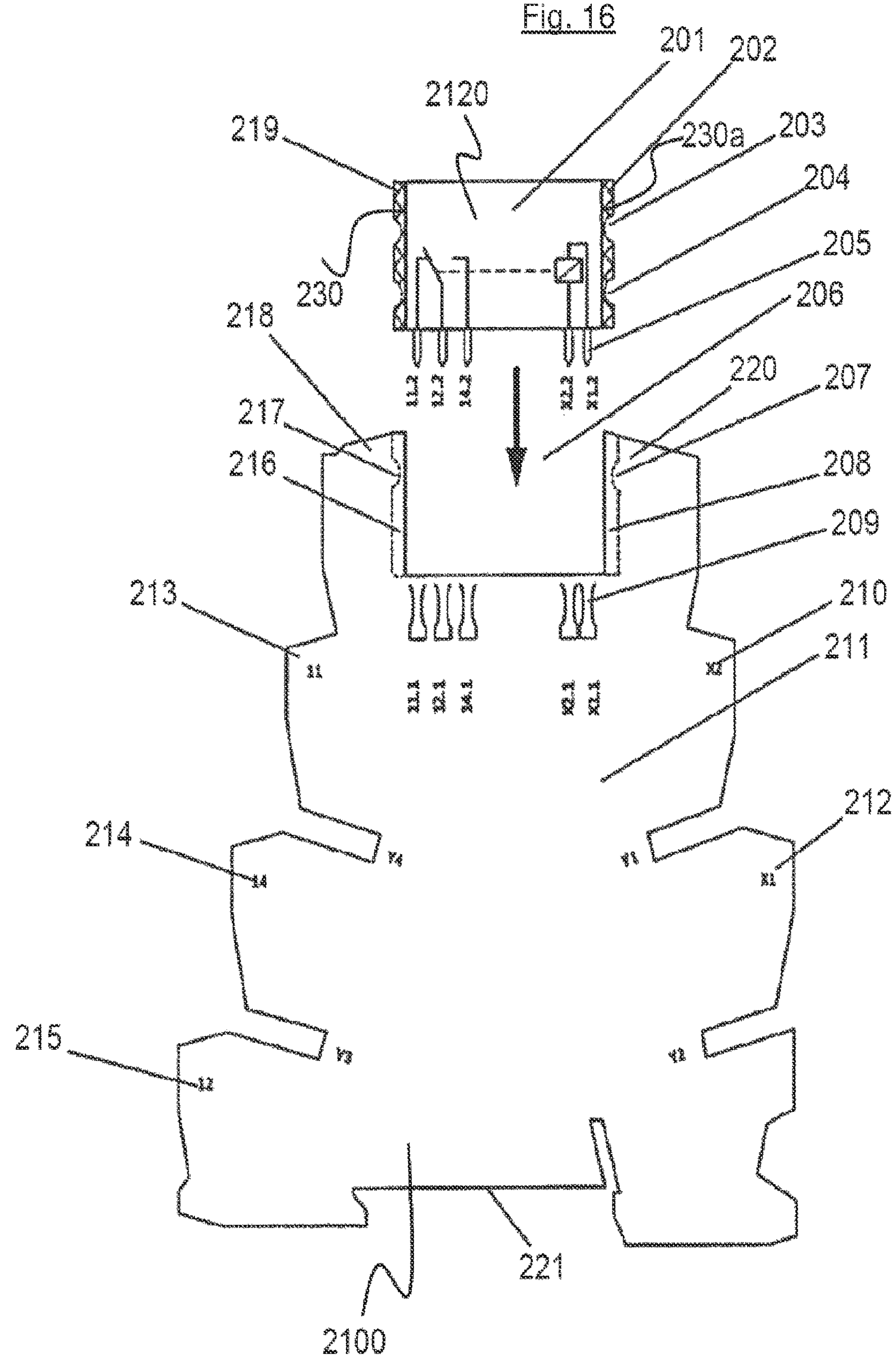
FIG. 16 shows a further embodiment.

FIG. 16 shows an electrical device 2100 comprising a plug-in socket 206 into which a component 201 to be accommodated can be inserted. The accommodated component 201 has a rib 202 and recesses 203, 204 on its first narrow side 230. On its underside or lower face, the accommodated component 201 has male terminals 205 for being mated with female terminals 209 of plug-in socket 206. Plug-in socket 206 has tabs 207 on its side walls, which can engage with the recesses 203 and 204 of the accommodated component 201.

The electrical device 2100 is also adapted to establish further electrical connections to the outside. It comprises, for example, the relay control terminal point 210, denoted by X2 in the figure, and the relay control terminal point 212, denoted by X1 in the figure. Furthermore, the electrical device 2100 has relay contact terminal points 213, 214, 215, denoted by numerals 11, 12, and 14 in FIG. 16.

The accommodated component 201 also has guide features 219 on its second narrow side 230*a*, which are mateable with plug-in socket 206.

On its lower face or underside, the electrical device 2100 has a recess 221 for being latched onto a mounting rail (not shown).

As can be seen from FIG. 16, the two narrow sides 230, 230*a* of the accommodated component 201 and the two flat faces are each arranged opposite to one another. Viewed circumferentially, flat faces alternate with narrow sides in succession. When viewed from above, in a top plan view, the component housing 2120 substantially has a rectangular shape.

Figure 17:
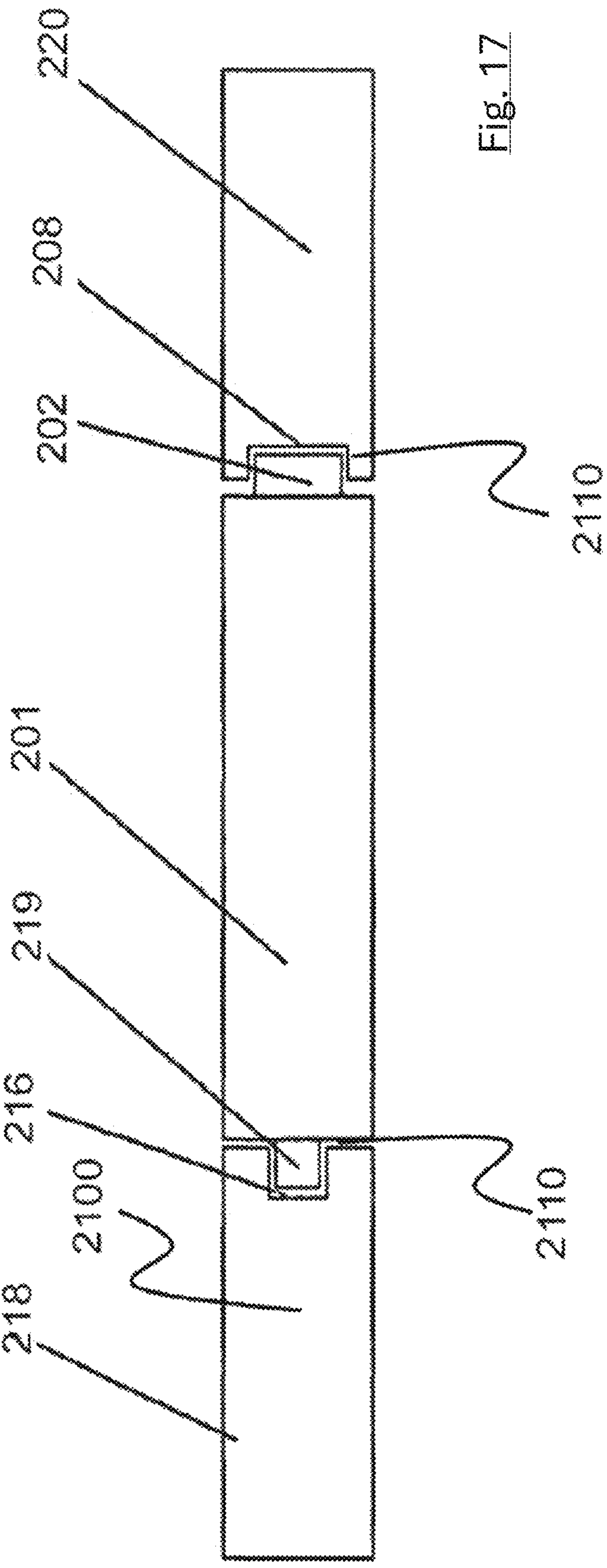
FIG. 17 is a plan view of an accommodated component in a plug-in socket.

FIG. 17 shows a top plan view of an accommodated component 201 which is inserted in plug-in socket 206. At its two narrow sides, the guide features 202, 219 are provided, with the rib 202 of guide features 2110 having a greater width than the rib 219. Therefore, it will be impossible to install the accommodated component 201 the wrong way round, i.e. with incorrect orientation, in the plug-in socket 206 of the electrical device 2100. This effectively prevents the electrical contacts 205 on the underside of the accommodated component 201 from being deformed or destroyed.

Figure 18:
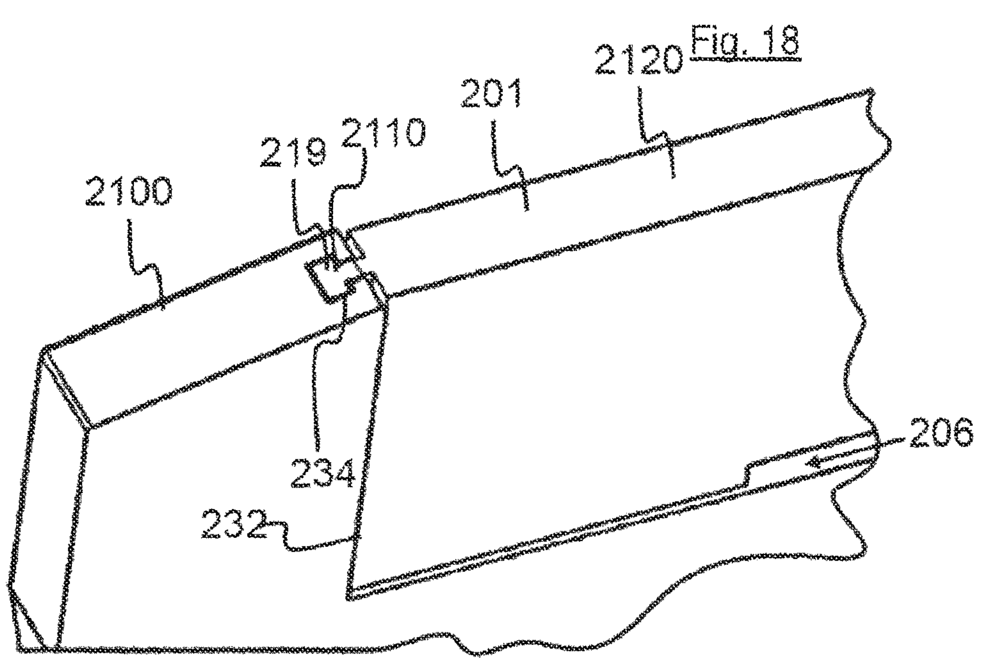
FIG. 18 shows a further embodiment of the present disclosure.

FIG. 18 shows a further embodiment, with a detail of the accommodated component 201 and part of the plug-in socket 206 shown in a view from above. The accommodated component 201 is fully inserted in the plug-in socket 206. The accommodated component 201 has a guide feature 219 on its first narrow side, which is designed in the form of a T-connection or dovetail connection. On the corresponding side wall 232, the plug-in socket 206 of the electrical device 2100 has a recess 234 which is mateable with the dovetail rib 219 and into which the guide feature 2110 can be slidingly introduced.

Figure 18A:
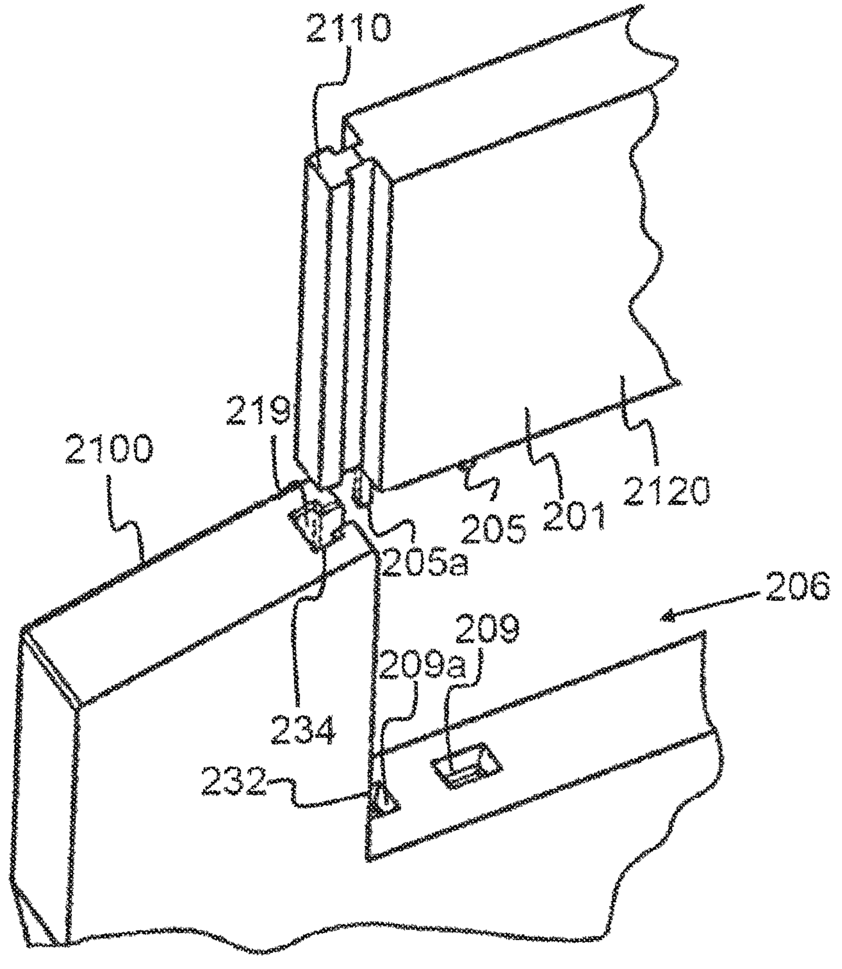
FIG. 18*a* shows the embodiment of FIG. 18 pulled out of the plug-in socket.

FIG. 18*a* shows the embodiment of FIG. 18, with the accommodated component 201 pulled out of the accommodation slot 206. The guide feature 2110, here in the form of a dovetail rib 219, can be clearly seen. Dovetail rib 219 can be slidingly introduced into the corresponding recess 234 in the first side wall 232 of the plug-in socket 206. The electrical terminals 205, 205*a* provided at the underside of the accommodated component 201 can be introduced into the female terminals 209, 209*a* of the electrical device 2100.

Figures 19, 19A:
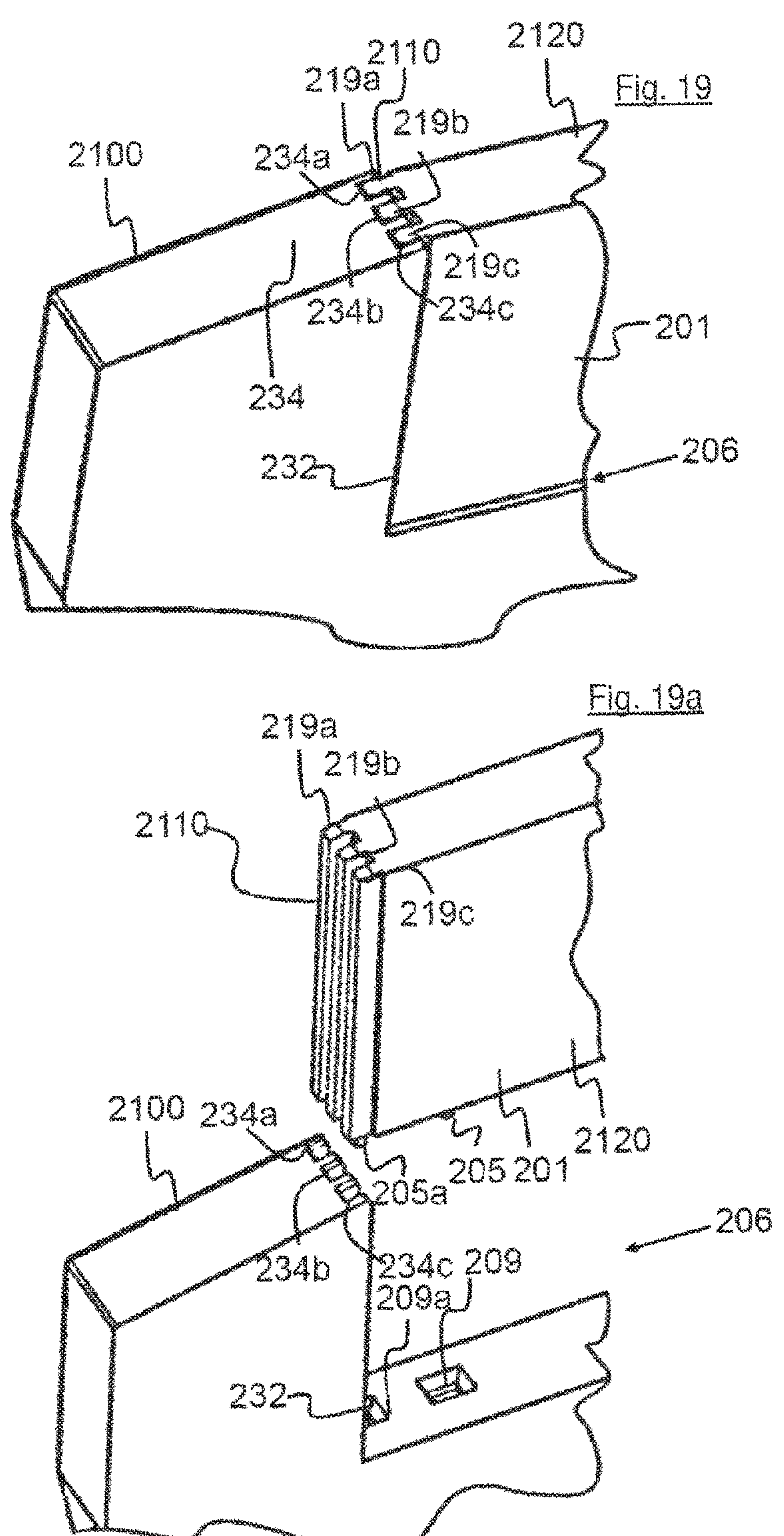
FIG. 19 shows a further embodiment of the present disclosure.
FIG. 19*a* shows the embodiment of FIG. 19 pulled out of the plug-in socket.

FIG. 19 shows a further embodiment, here with the guide feature 2110 implemented in the form of a comb structure 219*a*. The comb structure comprises three ribs 219*a*, 219*b*, and 219*c*, which can be introduced into corresponding recesses 234*a*, 234*b*, and 234*c* in the side wall 232 of the electrical device 2100.

FIG. 19*a* shows the embodiment of FIG. 19, with the accommodated component 201 completely pulled out of the plug-in socket 206 of the electrical device 2100. The male terminals 205, 205*a* that are visible underneath the accommodated component 201 can be introduced into the female terminals 209, 209*a*. The guide feature 2110 comprises the three ribs 219*a*, 219*b*, and 219*c*, which can be slidingly introduced into the corresponding recesses 234*a*, 234*b*, and 234*c* of the electrical device 2100. The guide feature 2110 at least makes it possible to prevent the accommodated component 201 from being inserted into the plug-in socket 206 in a tilted or reversed manner, which might cause defects on the accommodated component 201 or on the electrical device 2100. Rather, the accommodated component 201 has to be introduced straight from above, i.e. in extension of an imaginary axis through the electrical device 2100 and the plug-in socket 206 in extension downwards.

Figure 20:
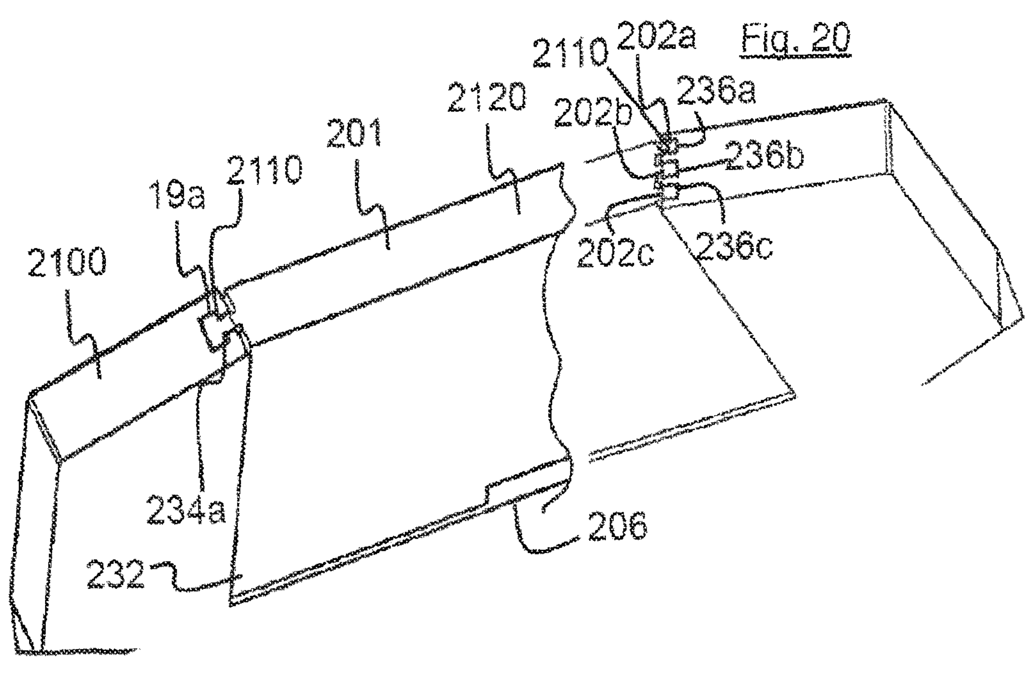
FIG. 20 shows yet another embodiment of the present disclosure.

FIG. 20 shows a further embodiment, with an accommodated component 201 inserted in the plug-in socket 206 of the electrical device 2100. On its first narrow side, the accommodated component 201 has the comb structure 202*a*, 202*b*, 202*c* for being introduced in a mateable manner into receiving grooves 236*a*, 236*b*, 236*c* of the plug-in socket 206. On the second narrow side opposite to the first narrow side, the accommodated component 201 has a second part of guide features 2110 in the form of a dovetail connection 219*d*. The guide feature 2110 on the first narrow side differs from the guide feature on the second narrow side. The comb structure arrangement 202*a*, 202*b*, 202*c* on the first narrow side of the accommodated component 201 cannot be mated with the recess 234*a* which is adapted for a dovetail structure. However, the dovetail-like guide feature 219*d* fits into the recess 234*a*. In this way, misaligned introduction of the accommodated component 201 into the plug-in socket 206, i.e. with reversed orientation, is effectively prevented. The guide features 2110 with differing sides 202*a* and 219*d* therefore not only provide for a straight and in particular vertical insertion of the accommodated component 201 into the plug-in socket 206, but also with correct orientation of the lateral sides of the accommodated component 201 into the plug-in socket 206.

Figure 20A:
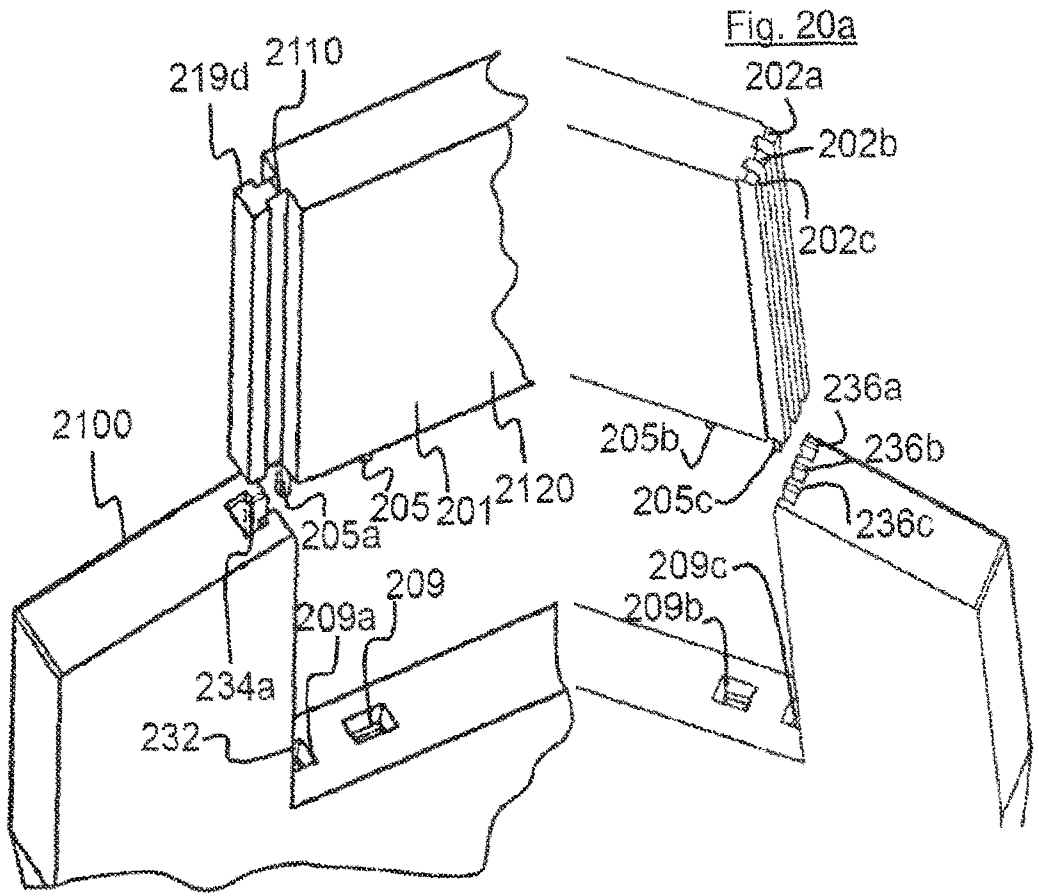
FIG. 20*a* shows the embodiment of FIG. 20 pulled out of the plug-in socket.

FIG. 20*a* shows the embodiment of FIG. 20, with the accommodated component 201 pulled out of the plug-in socket 206. Electrical terminals 205, 205*a*, 205*b*, and 205*c* can be introduced into female terminals 209, 209*a*, 209*b* and 209*c*. In this illustrated example, the female terminals are arranged symmetrically to one another. Such an arrangement would not be possible without the embodiment described here, since otherwise, without guide features 2110, the accommodated component 201 could be introduced into the plug-in socket 206 with its lateral sides reversed. With the guide features 2110 this is effectively prevented, so that the accommodated component 201 provided with the guide features 2110 can only be introduced into the plug-in socket 206 of the electrical device 2100 with correct orientation of its lateral sides.

Figure 21:
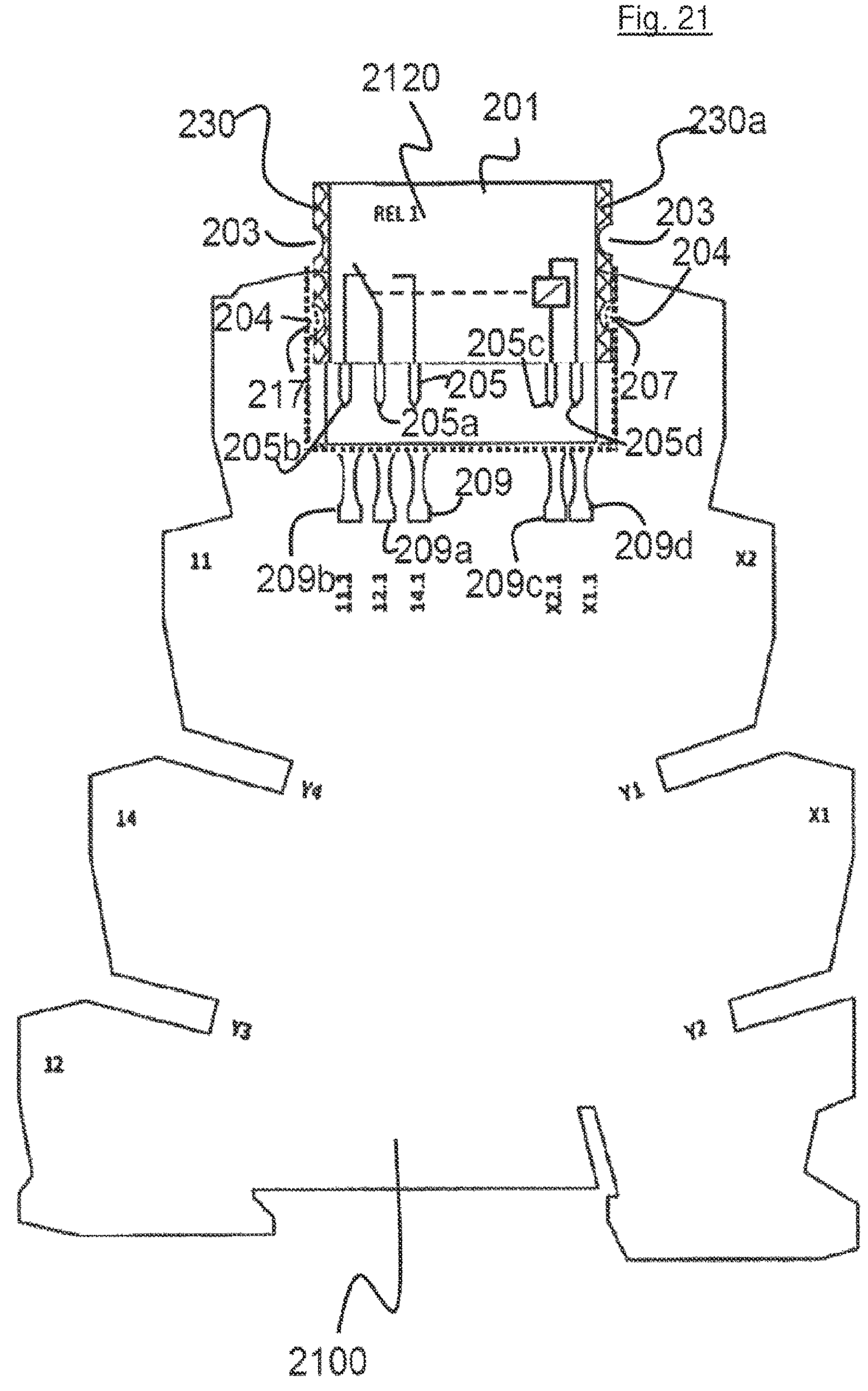
FIG. 21 shows an example of a guide feature with parking position.

FIG. 21 shows a further aspect, with an accommodated component 201 partially inserted in the accommodation slot 206 of an electrical device 2100. Electrical terminals 205, 205*a*, 205*b*, 205*c*, 205*d* are located so as to face the corresponding female terminals 209, 209*a*, 209*b*, 209*c*, 209*d* so that they could be plugged into the corresponding female terminals if the accommodated component 201 were inserted further into the accommodation slot 206. The accommodated component 201 has locking recesses on both of its narrow sides, which are interengageable with locking lugs 207 of the electrical device. The lower locking recess 204 provides a parking position for the accommodated component 201 in the accommodation slot 206. This means that when the accommodated component 201 is partially introduced into the accommodation slot 206, the indentation 204 will engage around locking lug 207 and the accommodated component 201 will be held there in a locked manner. By applying pressure from above on the accommodated component 201, the latter can be pushed further into the accommodation slot 206, but to this end, a certain holding force has to be overcome, which is caused by the form-fitting or positive connection between the lower locking recess 204 and the retaining lug 207. When the accommodated component 201 is fully installed in the accommodation slot 206, the locking lug 207 engages in the respective upper locking recess 203 which is provided on the respective narrow side of the accommodated component 201. The shape of upper locking recess 203 corresponds to that of locking lug 207, and it will be arranged at the same level as the locking lug 207 when the accommodated component 201 is fully inserted into the accommodation slot 206. This provides for a further increase in the retaining force of the accommodated component 201 in the slot 206, thereby ensuring reliable retention and/or stable locking of the accommodated component 201 in the slot 206.

It will be apparent to those skilled in the art that besides all of the embodiments of different guide features 2110 illustrated herein, that can be provided on the respective sides of the accommodated component 201, such as the comb structure, dovetail structure, T-connection, and different grooves, it is also possible to use other forms for the guide features 2110 in order to encode for insertion with the correct orientation of the accommodated component 201 in the accommodation slot 206. For example, the dovetail structure can have different slopes on the opposite sides of an accommodated component 201, or the slopes can extend inversely to one another, i.e. so as to intersect. The comb structure may have different numbers or different widths of combs, for example. The guide features 2110 may comprise semicircles with different diameters which interengage, for example, to encode for insertion with the correct orientation of the accommodated component 201. Lastly, triangular tips with different slopes may also be provided. Other forms are possible as well and can be chosen depending on the application purpose.

This also makes it possible to keep the accommodated component 201 compatible only for particular plug-in sockets 206. In this way it is possible, for example, to provide specific guide features 2110 on the accommodated components 201, which only fit into selected plug-in sockets 206, for example if the application differs in terms of the electrical voltage that is employed. Thus, in addition to ensuring installation of the accommodated component 201 in the plug-in socket 206 in the correct orientation, the accommodated component 201 can only be used in a plug-in socket 206 it is intended for. This is of particular interest when a plurality of plug-in sockets 206 are arranged next to one another or in a narrow space and it may be difficult to identify the correct plug-in socket 206 due to the narrow space. In this case, the guide feature 2110 may provide additional assistance in selecting the correct plug-in socket 206.

Figure 22:
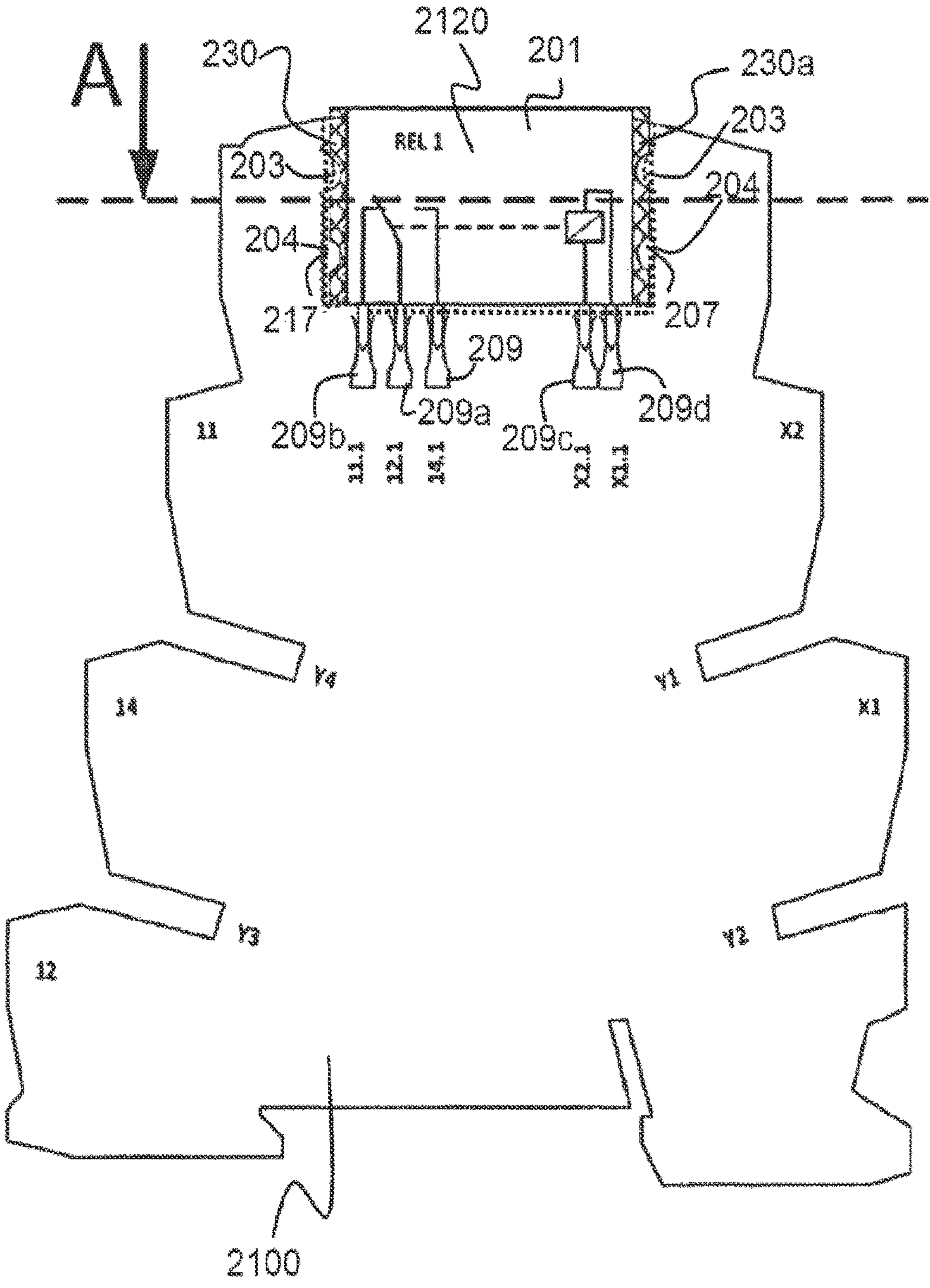
FIG. 22 shows the embodiment of FIG. 21 fully inserted into the plug-in socket.

FIG. 22 shows the illustrative embodiment of FIG. 21, with the accommodated component 201 fully inserted in slot 206, and with the locking lug 207 engaged in the locking recess 203 of the receiving component 201. In this position, the accommodated component 201 is held in the accommodation slot 206 in a locked manner.

In summary, the present disclosure permits to solve a variety of problems that may arise in the daily use and operation of accommodated components 201. With the special configurations of guide features 2110, the process of fitting the accommodated component 201 in the plug-in socket 206 is considerably simplified, while at the same time ensuring correct alignment and orientation of the accommodated component 201 in the plug-in socket 206. This can be achieved by an asymmetrical arrangement of the guide features 2110 on the accommodated component 201. The guide features 2110 also implies a precise guidance of the accommodated component 201 if they are implemented as guide rails, as presented here. As illustrated, the guide features 2110 can be structured according to various alternatives, such as the dovetail connection shown, which may also be combined such that the widths of the ribs are the same on both sides of the accommodated component 201, but the slopes of the recess or groove are different or even inverse to each other.

The asymmetry of the guide features 2110 can also be implemented by the comb structure as illustrated, and in this case also with a different number of combs or with different widths of the ribs.

Hence, the idea of the present aspect of the description is aimed at providing the asymmetry of the guide features 2110, and further illustrative embodiments will readily suggest themselves to a person skilled in the art based on the illustrative embodiments and also come within the scope of the description presented here, alone by providing the asymmetry of the guide feature on the first narrow side of the accommodated component 201 compared to that on the second narrow side of the accommodated component 201.

It has been found that a particularly simple basic principle is to provide different tongue-and-groove connections on the accommodated component 201 and the accommodation slot 206 of the electrical component 2100, respectively. It is conceivable in this case to provide the tongue or tongues on the accommodated component 201 and the groove or grooves in the accommodation slot 206, or inversely, to provide the tongue or tongues in accommodation slot 206 and the groove or grooves on the accommodated component 201.

The present aspect of the description also relates to the partial aspect of reliably retaining the accommodated component 201 in the accommodation slot 206 without having an electrical connection established between the accommodated component 201 and the electrical device 2100. For this, the present specification provides a parking position which implements a firm seat of the accommodated component 201 in the accommodation slot 206 and at the same time reliably places the electrical terminals at a distance apart from one another. This means that the electrical connection will remain interrupted even in the event of vibration, i.e. in a shock or impact protected manner.

The locking for the parking position has been illustrated here by having a tab provided in the socket 206, which can engage in a resilient recess on the accommodated component 201. The interaction of recess and tab leads to a firm seat of the accommodated component 201 in the socket 206. An inverse configuration with this solution principle is likewise conceivable here again.

Figure 23:
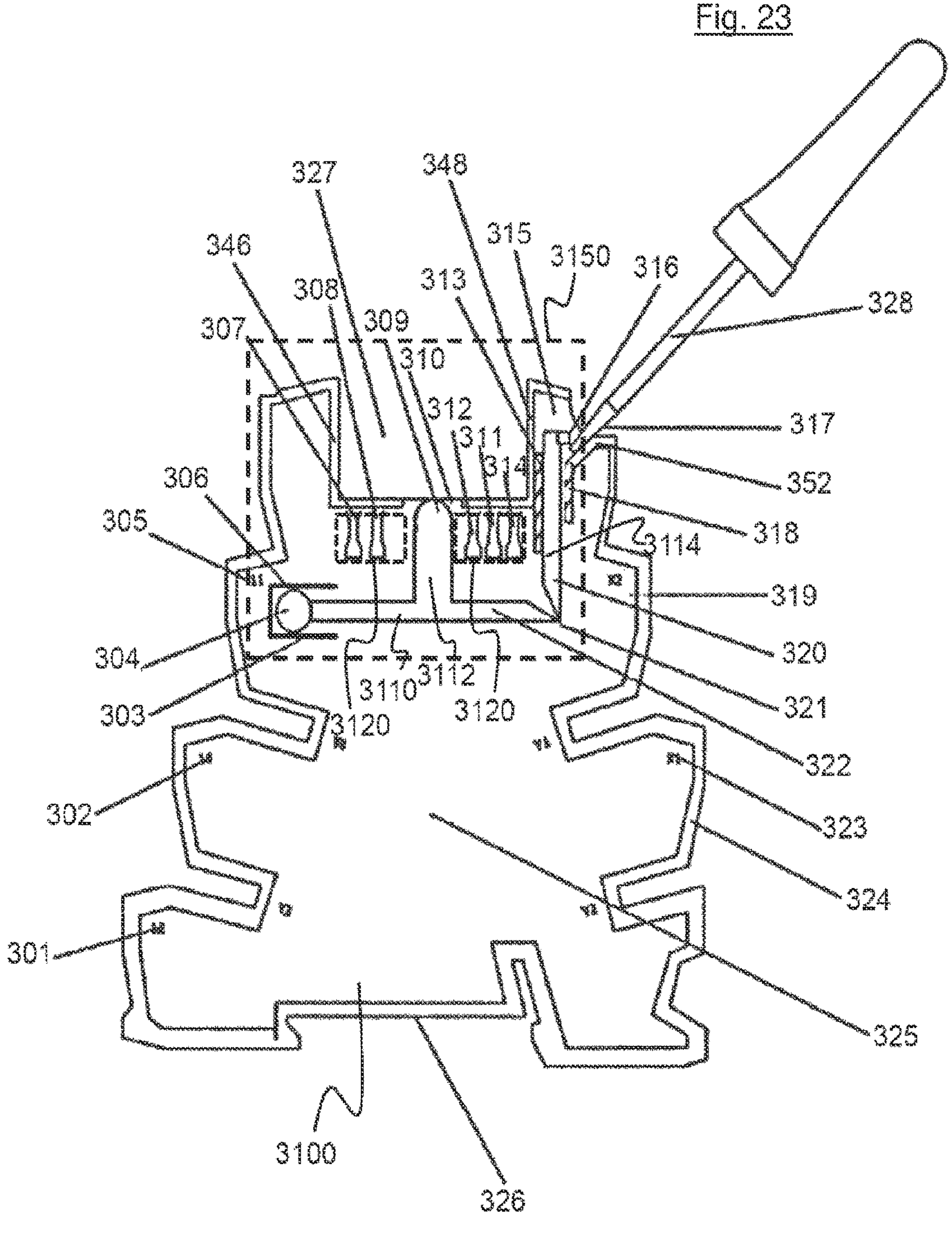
FIG. 23 shows a further embodiment.

Referring to FIG. 23 which illustrates another embodiment comprising an ejection mechanism that is located in the contact plane 3150. The ejection device 3110 comprises a movable lever with a bearing point 304 that is guided in a slide rail 303, 306. The actuator 320 is actuated with a hand tool 328, in this example a screwdriver, as shown.

The actuator 320 can be levered forwards or upwards by a user using the hand tool 328 and by exerting manual pressure on the hand tool 328 so as to pushed the inserted component 351 out of the slot 327. The point 309 of pressure applied to the inserted component 351 from below lies in the common contact plane 3150 with terminals 308, 311, 312, 314, and 307. During actuation, the pressure point 309 is shifted from right to left along the contact line 350 (cf. FIG. 27) in the contact plane 3150. The contact line connects the illustrated electrical terminals 307, 308, 311, 312, and 314 and the pressure point 309 of the ejection mechanism 3110.

In the illustrated embodiment, the electrical component 3100 has lateral clamp terminals, here clamp terminals 12, 14, 11, X1, and X2, denoted by reference numerals 301, 302, 305, 319, and 323. These clamp terminals can be used to electrically connect the electrical component 3100 externally. The second electrical terminals 307, 308, 311, 312, and 314 are all in the form of female terminals. Terminals 307 and 308 are responsible for controlling the relay, terminal 311 is the root terminal, terminal 312 is the normally closed contact, also known as break contact, and terminal 314 is the normally open contact, also known as make contact. The installation slot 327 for the installation component 351 comprises the left slot wall 346 and the right slot wall 348.

The actuation assembly 3114 of the ejection device 3110 is arranged in an actuator slot 315. Actuator slot 315 has an engagement surface 313 for the actuator 3114 and an engagement surface 318. The actuator 3114 has an actuation head 316 for engagement of the hand tool 328. The actuation head 316 can be mechanically or chemically reinforced, i.e. toughened, to be able to accommodate a greater force. The hand tool 328 engages on the tool engagement area 352 and is directed to below the actuation head 316. With a pressing movement of the hand tool 328 on the actuator 3114 and subsequent rotation of the hand tool 328 in the downward direction, the ejection device 3110 is actuated by displacing the actuator 3114 in the upward direction. The actuator 3114 bears against the engagement surface 313 and is supported thereby against the pressure force, so that the actuator 3114 is not laterally displaced or pivoted by the pressure exerted by the hand tool 328.

A living hinge is provided between the actuator 3114 and the ejection lever 3112 to connect the two portions 3112, 3114 to one another. The electrical component 3100 comprises a housing shell 324.

Figure 23A:
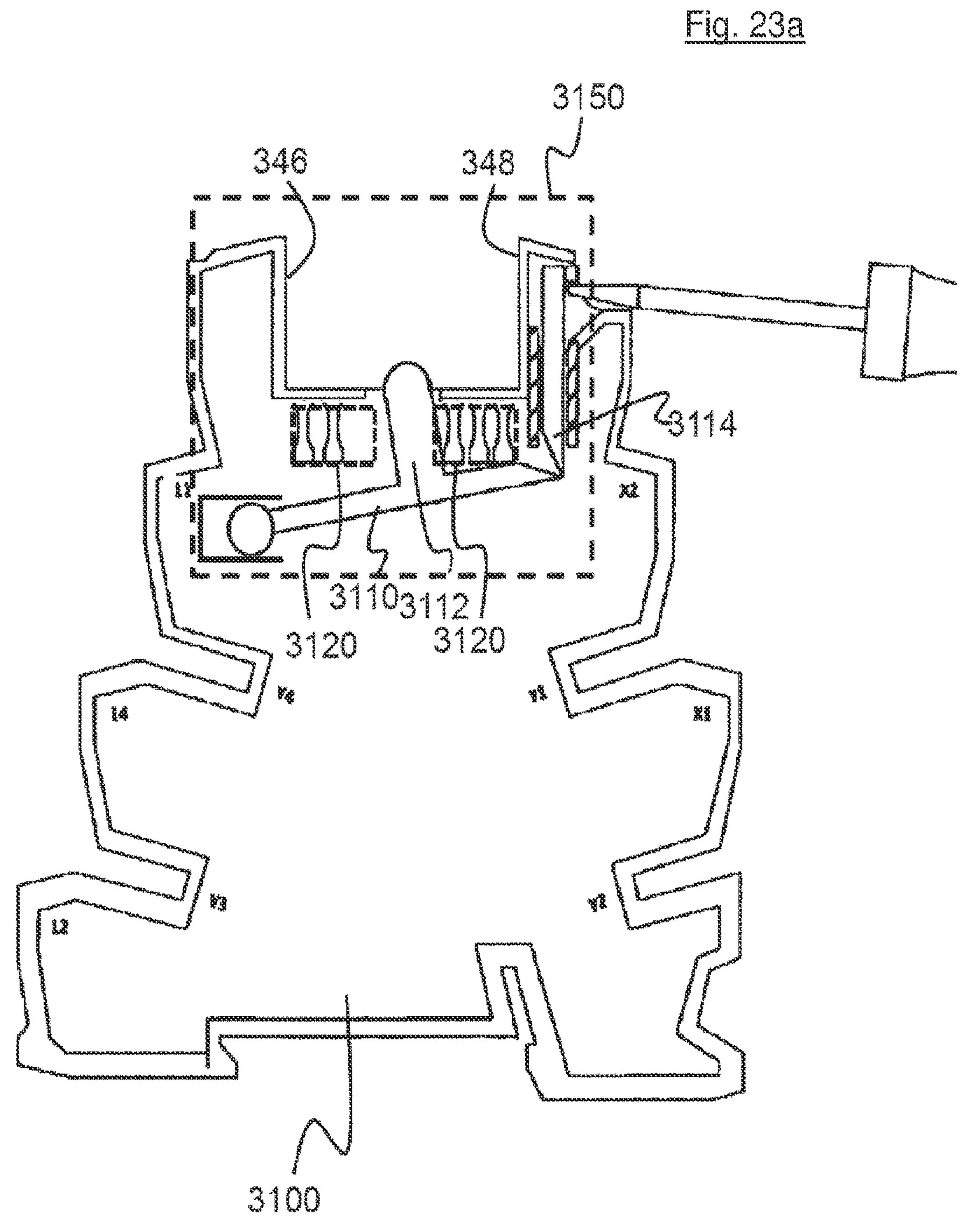
FIG. 23*a* shows the embodiment of FIG. 23 during or at the end of actuation.

FIG. 23*a* shows the embodiment of FIG. 23, with the ejection device 3110 being actuated. The hand tool 328 has been pivoted in a downward direction of rotation, so that the actuation portion 3114 has been displaced upwards. The ejection portion 3112 connected thereto by living hinge 321 now protrudes into the insertion slot 327. A component 351 arranged in the slot 327 would now be pushed out of the slot (cf. FIGS. 26 and 26*a*). As can also be seen from FIG. 23*a* in conjunction with FIG. 23, even when the ejection device 3110 is actuated, the terminal area 3120 is kept clear and the ejection device does not touch or interfere with the terminals 307, 308, 311, 312, and 314. The entire ejection device 3110 is arranged in the common contact plane 3150.

Figure 24:
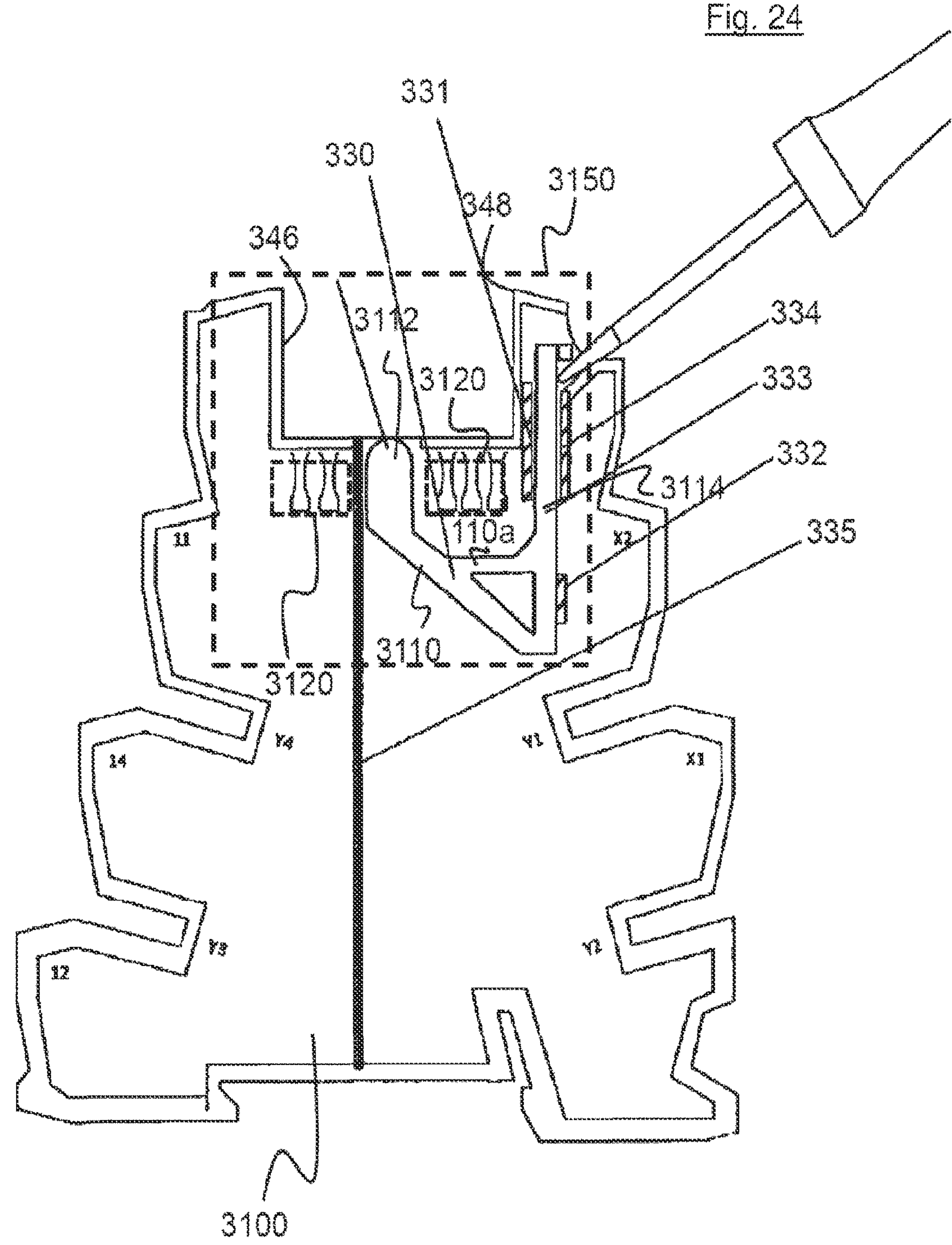
FIG. 24 shows yet another embodiment.

Referring to FIG. 24 which illustrates another embodiment in which the ejection device 3110 is made in one piece such that the actuating lever 3114 is integrally formed with the ejector 3112. A strut 3110*a* is integrated for strengthening or stiffening the ejection device. It will be obvious to a viewer that the lower part of the ejection device 3110 may also be implemented from solid material or with different recesses without departing from the scope of the present specification. In this example, the ejection device 3110 is designed as a type of slider or pusher 330 which is operable to cause the ejection of the accommodated component 351 (cf. FIGS. 26 and 26*a*) simply by a vertical displacement, without complicated pivoting. To support the slider 330, the electrical component 3100 has engagement points 331, 332, and 334 adapted and arranged for this purpose, so that the ejection device 3110 will not perform any rotational movement or only a smallest possible rotational movement, even when being actuated using the hand tool 328, but will rather only perform a translational movement upwards to eject the accommodated component 351 from slot 327.

The embodiment of FIG. 24 comprises a partitioning wall 335 which improves the electrical insulation between terminals 311, 312, and 314 on one side and terminals 307 and 308 on the other side. In this embodiment, the ejection device 3110 can be arranged entirely on one side of the partitioning wall 335.

The embodiment as shown in FIG. 24 comprises a large number of similar components as shown in FIG. 23. These components are not described again in conjunction with FIG. 24 in order to not unnecessarily lengthen the description. It will be obvious for the viewer that the reference numerals and description of components from FIG. 23 can also be applied accordingly to FIG. 24 as well as to the further figures, without being specified in detail in each case. For that matter, the same reference numerals also indicate the same components in different figures.

Figure 24A:
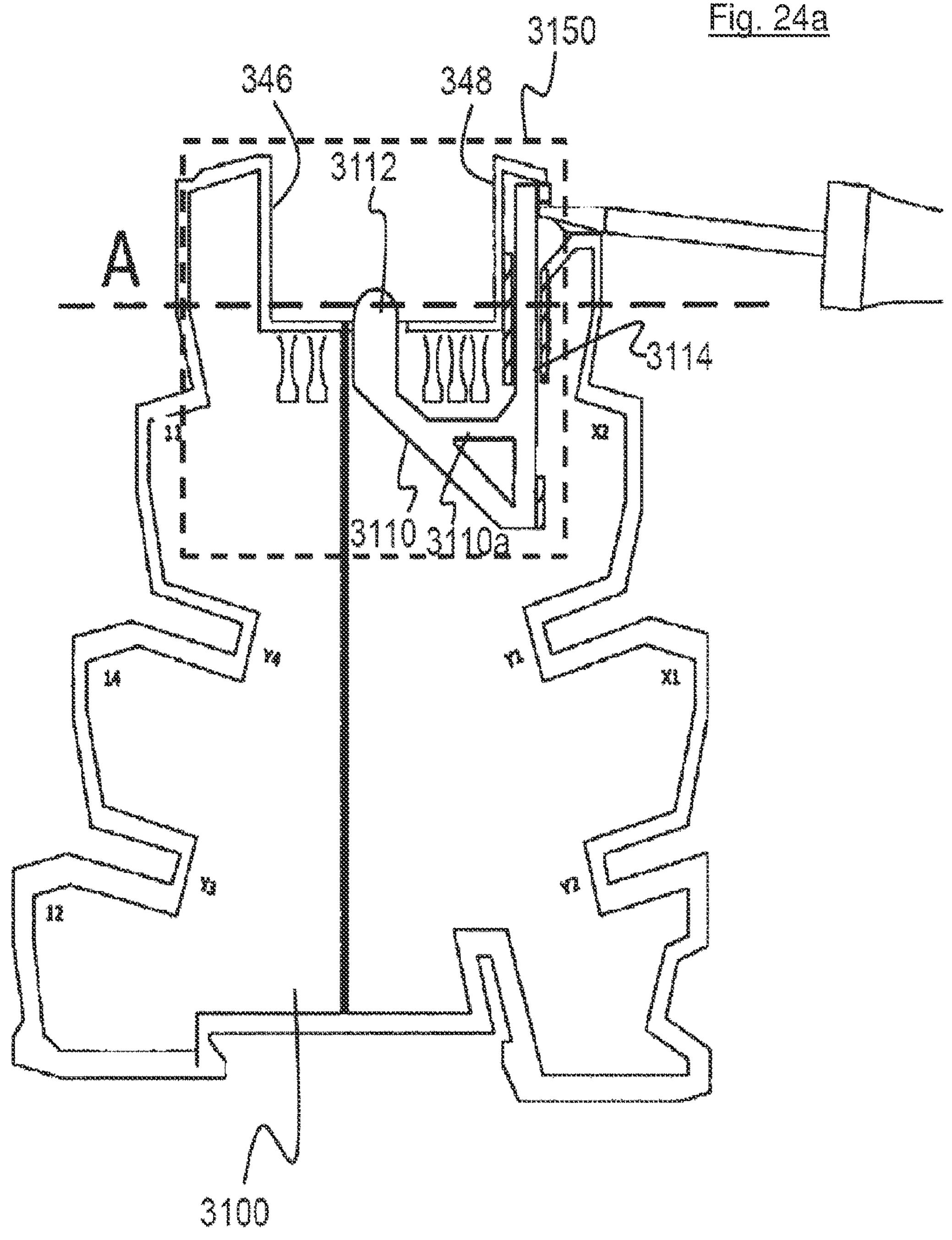
FIG. 24*a* shows the embodiment of FIG. 24 during or at the end of actuation.

FIG. 24*a* shows the embodiment as illustrated in FIG. 24, with the ejection device 3110 being actuated using the hand tool 328 on actuator 3114. By exerting a pressure force on the actuation portion 3114 together with a downward rotary or rotational movement of the hand tool 328, the actuation portion 3114 is displaced upwards in a translational movement, and at the same time the ejection portion 3112 which is formed integrally therewith is displaced in an upward direction in order to eject a component 351 that is possibly accommodated in the slot 327. In conjunction with FIG. 24 it will be apparent that this embodiment, again, does not interfere with the second electrical terminals of the electrical component 3100, rather the contact area 3120 can be kept completely undisturbed. The entire ejection device 3110 is arranged in the common contact plane 3150 with the electrical terminals 307, 308, 311, 312 and 314 of the electrical component 3100.

Figure 25:
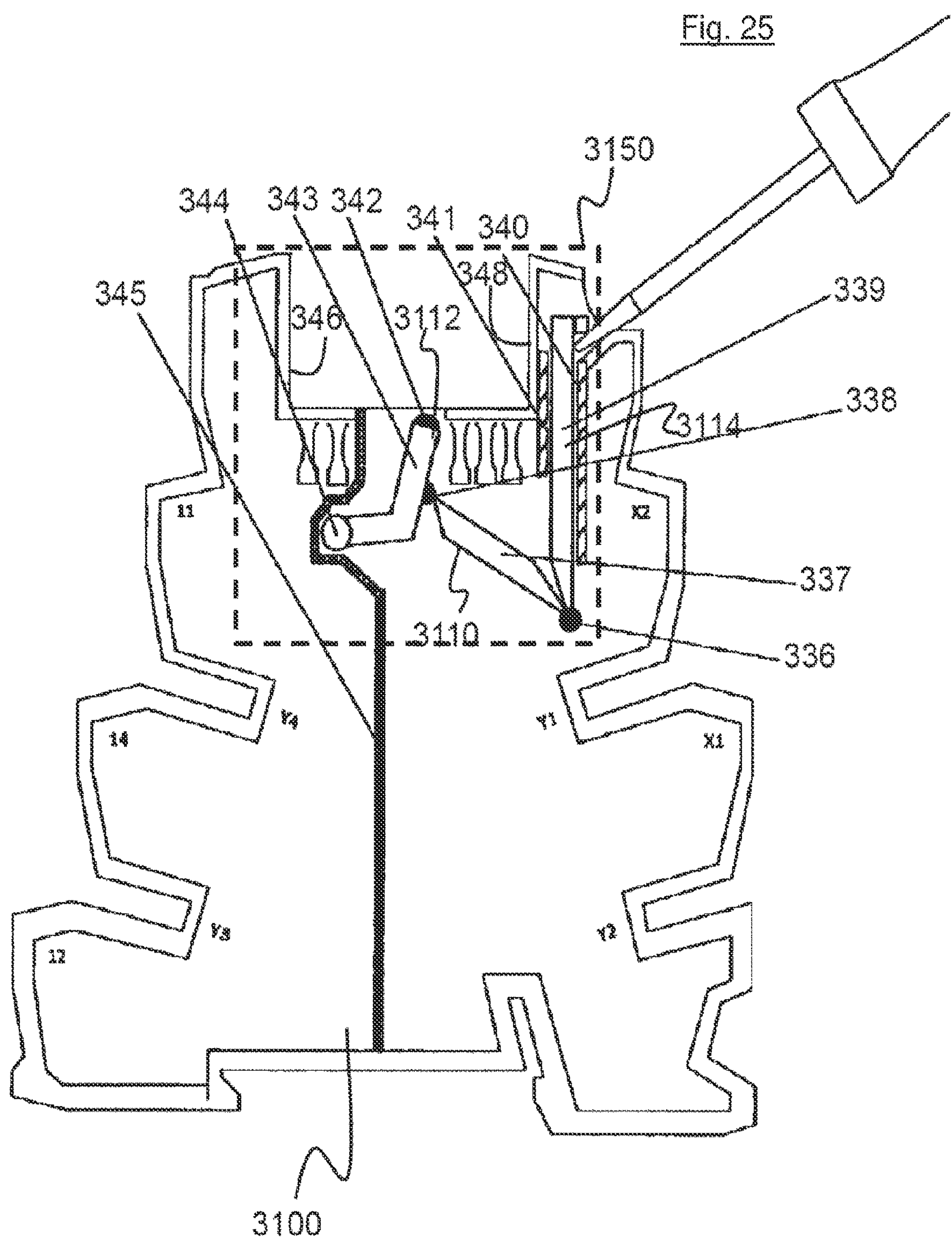
FIG. 25 shows yet another embodiment.

FIG. 25 shows yet another embodiment in which, likewise, the components of electrical component 3100, which have already been described in conjunction with FIG. 23, are not denoted and described again. FIG. 25 shows the ejection device 3110 with an actuator 339 that can be operated using the hand tool 328. Actuator 339 is connected to the auxiliary lever 337 by a living hinge 336, and the auxiliary lever 337 in turn is connected to the ejection lever 343 by living hinge 338. Ejection lever 343 has a pivot 344 that is mounted on the housing 325 of the electrical component 3100. Ejection lever 343, in turn, has the pressure point 342 which can exert a pressure force on an inserted component 351 for the purpose of ejecting it from the slot 327.

The actuation portion 339 is mounted such that a rotational movement is largely prevented and only a translational movement in the upward direction is freely possible. For this purpose, engagement points 340 and 341 are provided in the housing 325 of the electrical component 3100.

Furthermore, the electrical component 3100 again has a partitioning wall 345 which provides for better electrical insulation of a first part of the electrical terminals 307, 308 from a second part of the electrical terminals 311, 312, and 314.

Figure 25A:
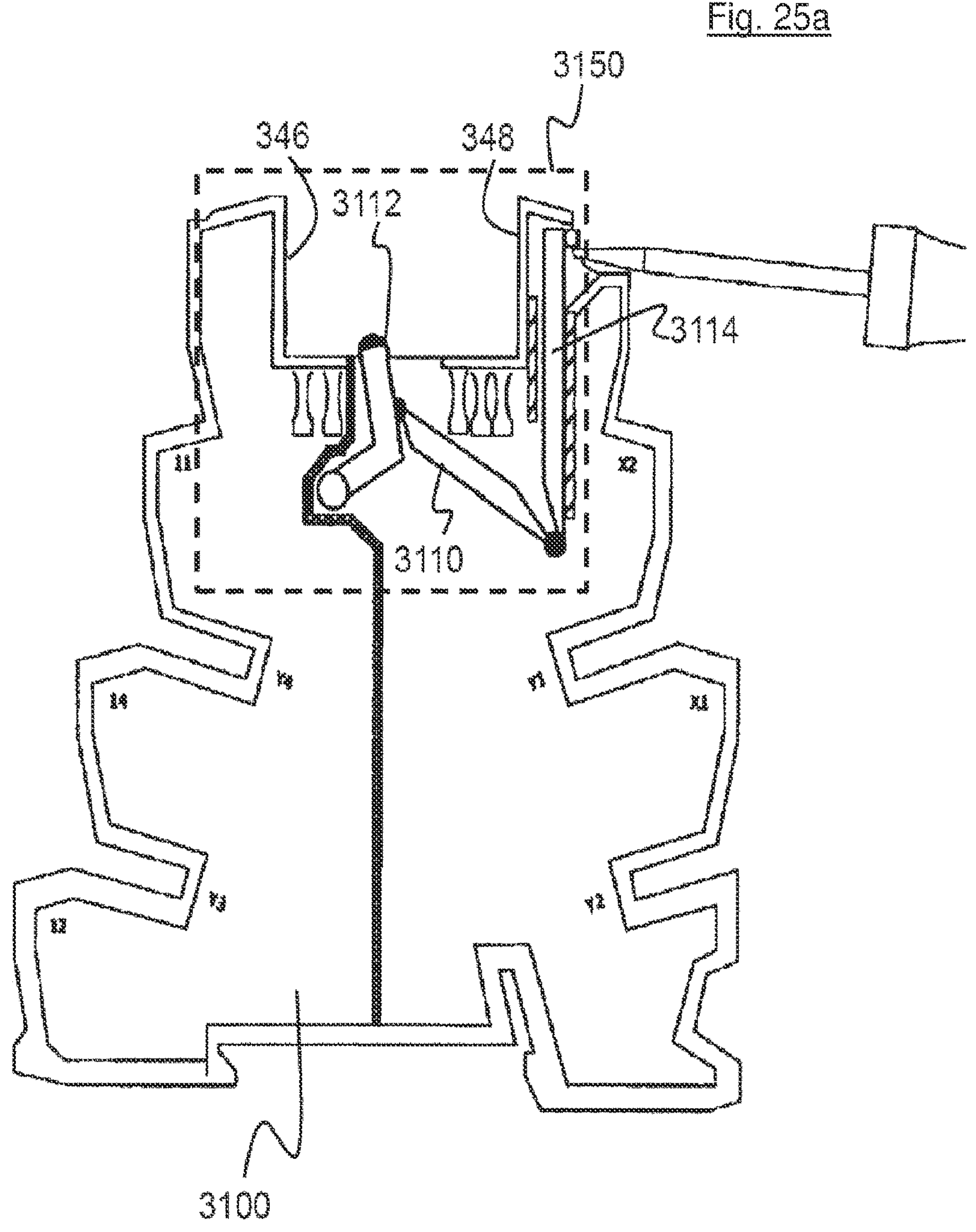
FIG. 25*a* shows the embodiment of FIG. 25 during or at the end of actuation.

Referring to FIG. 25*a* which shows FIG. 25 in the actuated position. The hand tool 328 reaches below the actuation head 316 and moves the actuation portion 3114 upwards in a translational movement. The auxiliary lever 337 of the ejection mechanism 3110 is caused to pivot by the translational movement of the actuation portion 3114, while the actuation portion is now being urged against engagement point 340. When the ejection mechanism 3110 is further translated upwards using the hand tool 328, a pressure force will then be exerted on the ejection lever 343 and cause it to pivot upwards. The ejection lever 343 will therefore raise through the bottom of slot 327 and be able to push an inserted component 351 out of the slot 327. Again, the entire ejection device 3110 is arranged in the common contact plane 3150. The electrical terminals 307, 308, 311, 312, and 314 are again arranged in the undisturbed contact area 3120, which is kept clear of the ejection device 3110, since the individual components 3112, 3114 of the ejection device 3110 pivot around the contact area 3120.

Figure 26:
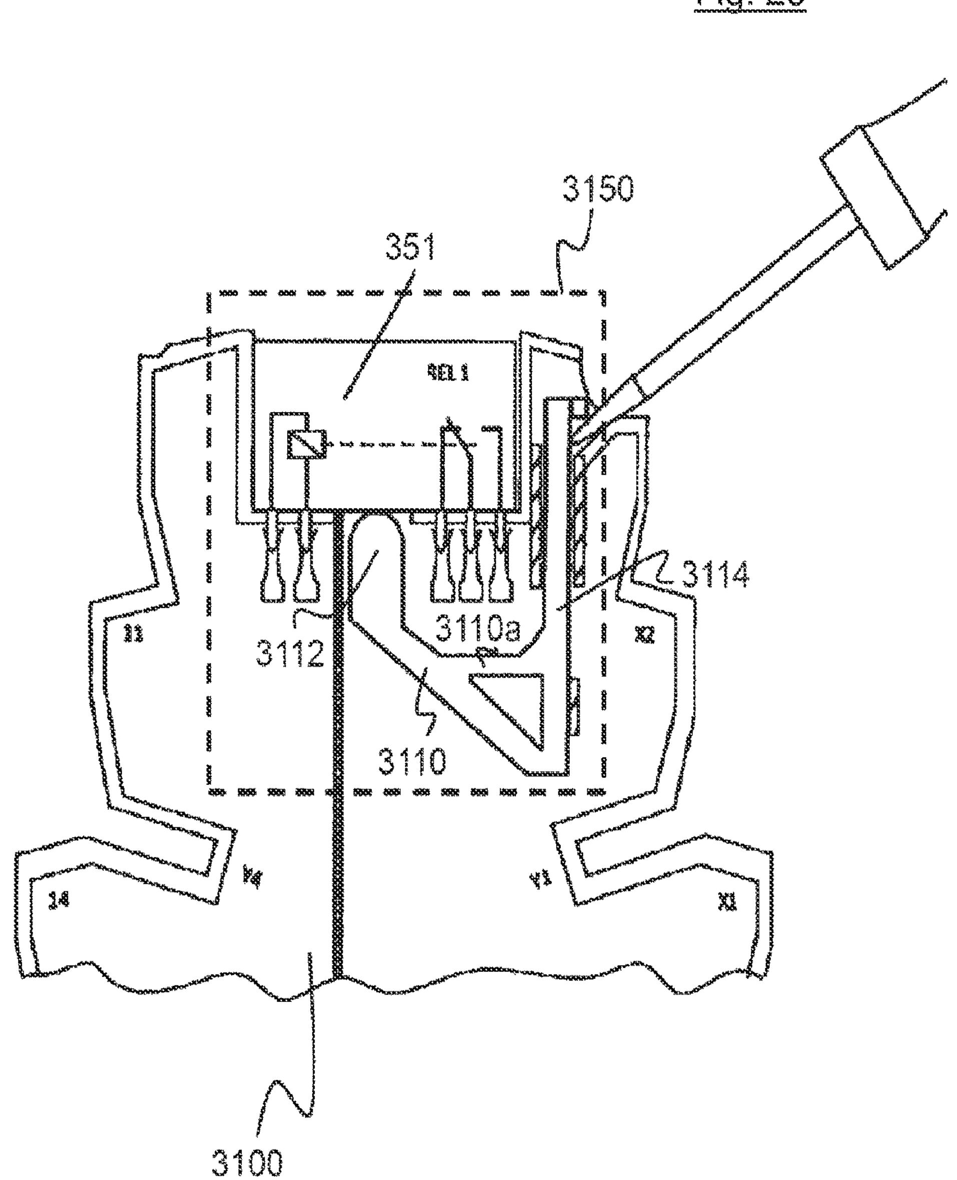
FIG. 26 shows the embodiment of the present disclosure according to FIG. 24 with the accommodated component inserted.
Figures 26A, 27:
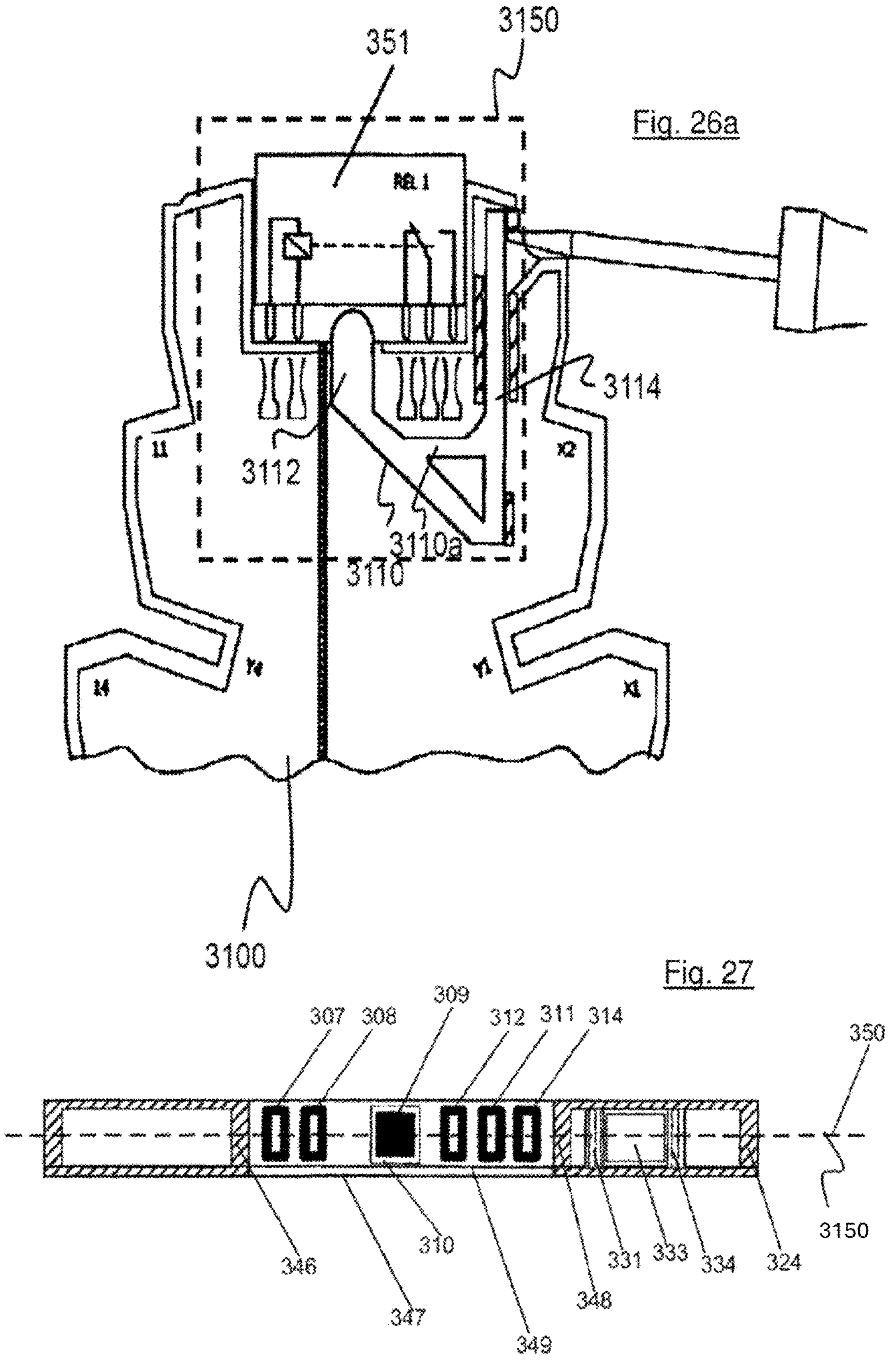
FIG. 26*a* shows the ejection of an accommodated component.
FIG. 27 is a partially sectional top plan view of the electrical component, cut along sectional plane A as indicated in FIG. 24*a*, showing second electrical contacts, and with the common contact plane indicated.

FIG. 26 shows an embodiment with the accommodated component 351 installed in slot 327. The ejection device 3110 is arranged below the accommodated component 351 and is in its rest position. No force or only a small force is exerted on the accommodated component 351 by the ejection device 3110. A hand tool 328 is engaged on tool engagement area 352 and is levered below the actuation head 316. FIG. 26*a* illustrates the further movement of the ejection device 3110 for pushing the inserted component 351 out of slot 327. The hand tool 328 is pivoted in the downward direction, so that the actuation portion 320 is translated upwards by a levering force applied via tool engagement area 352. When the ejection device 3110 is actuated further, the ejection portion 3112 which is integrally formed with the actuation portion will press against the inserted component 351 from below, so that the latter is then pushed out of the slot 327. In the position shown in FIG. 26*a*, the electrical terminals of the inserted component 351 are already completely separated from the second electrical terminals 307, 308, 311, 312, and 314 of the electrical component 3100, so that the inserted component 351 already protrudes clearly from the slot of the electrical component 3100 and can now be grasped manually with one hand, for example, without great effort.

Referring to FIG. 27 which shows a top plan view of the second electrical terminals 307, 308, 311, 312, and 314 of the accommodation slot 327, and which shows the pushing model 309 of the ejection lever 3112. It can be seen that the electrical terminals 307, 308, 311, 312, and 314 as well as the visible parts of the ejection device 3110, i.e. the ejection lever 3112 and the actuation portion 3114, are arranged in the common contact plane 3150 along contact line 350. As can be seen from this view, it is particularly preferred for a force on the pressure point 309 to be exactly in the center of the forces. The prevention of the relay or accommodated component 351 from becoming tilted when being ejected can be further improved in this way. Furthermore, it becomes obvious from FIG. 27 that the arrangement of the terminals in a common contact plane 3150 with the ejection device 3110 allows to further reduce the installation width of the entire electrical component 3100. In contrast to the prior art designs of the ejection device 3110, all of which are arranged laterally offset next to the electrical terminals of the insertion component, it is possible to minimize the overall installation width of the entire electrical component 3100 to the width of the terminals or to the width of the ejection device 3110.

Figure 28:
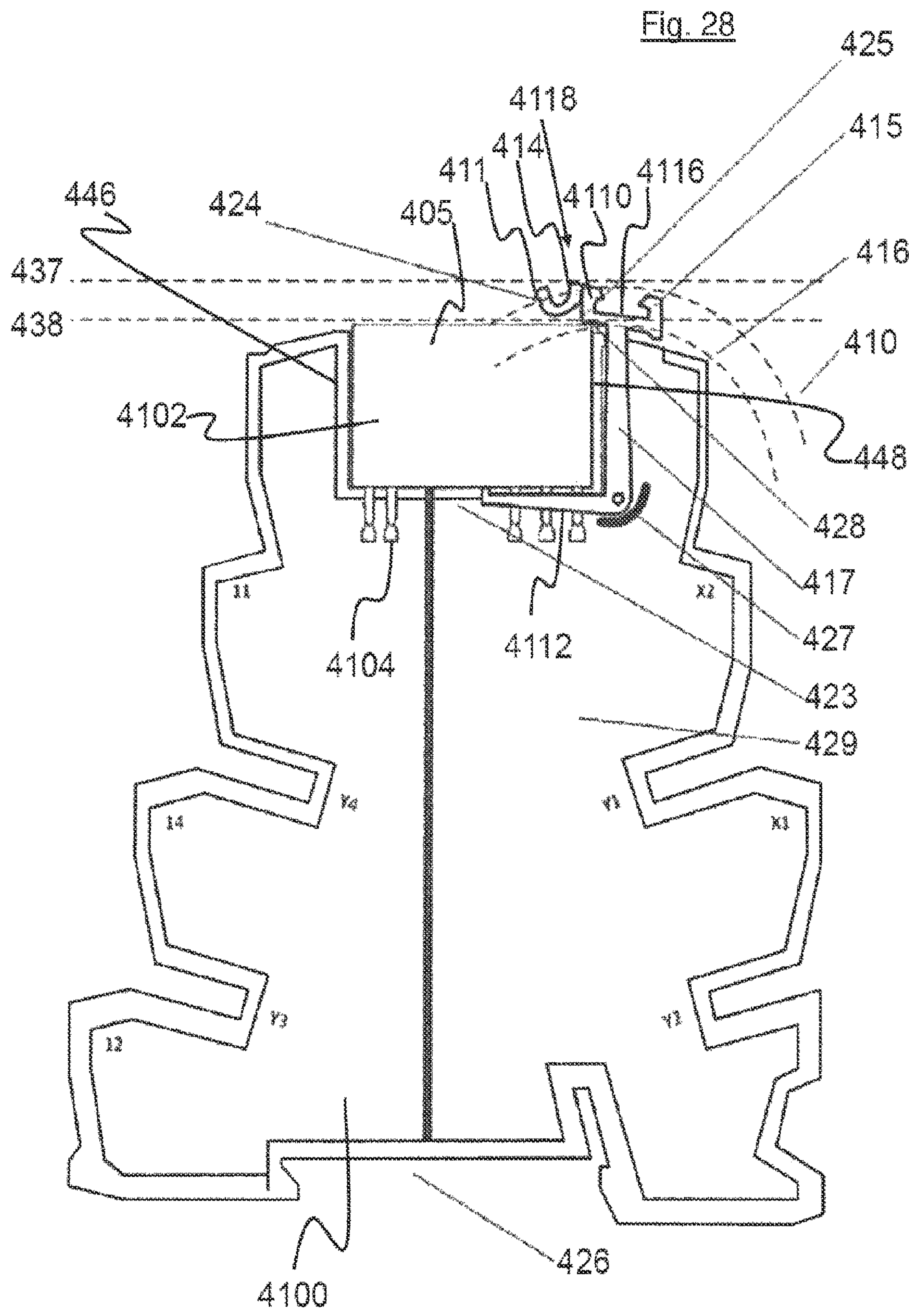
FIG. 28 shows a further embodiment of the present disclosure.

Referring to FIG. 28 which shows an illustrative embodiment comprising an electrical component 4100 with an accommodated component 405 installed in the active position in plug-in socket 4102. The electrical component 4100 has an ejection device 4110. The ejection device 4110 comprises a lever 417 which is the actuating portion of the ejection device 4110. Lever 417 is pivotable. For pivoting the lever 417, it can be moved away from the accommodated component 405 and thus pivoted against the engagement surface 427. In the embodiment shown, the accommodated component 405 has been completely inserted into the slot 423 of the electrical component 4100. The tab 414 of retaining means 4118 rests on the accommodated component 405 so that the accommodated component 405 is additionally held in the slot 423 by tab 414. The accommodated component is thus installed in accommodation slot 423 with its upper side flush with line 438 which illustrates the active position. By pivoting the ejection device 4110 along line 416 which represents the corresponding pivoting range, the accommodated component 405 can be pushed out by the ejection portion from underneath.

In the illustrated embodiment, the electrical component has lateral clamp terminals, here clamp terminals 301, 302, 305, 323 and 319 (12, 14, 11, X1, and X2). The electrical component 4100 can establish external connections at these clamp terminals. The second electrical terminals 4104 of the electrical component 4100 are in the form of female terminals. The installation slot 423 has a left slot wall 446 and a right slot wall 448. Ejection device 4110 has an actuation head 4116 where a force can be applied to actuate the ejection device 4110. For example, a hand tool can be engaged here, or it can be actuated manually.

Figure 28A:
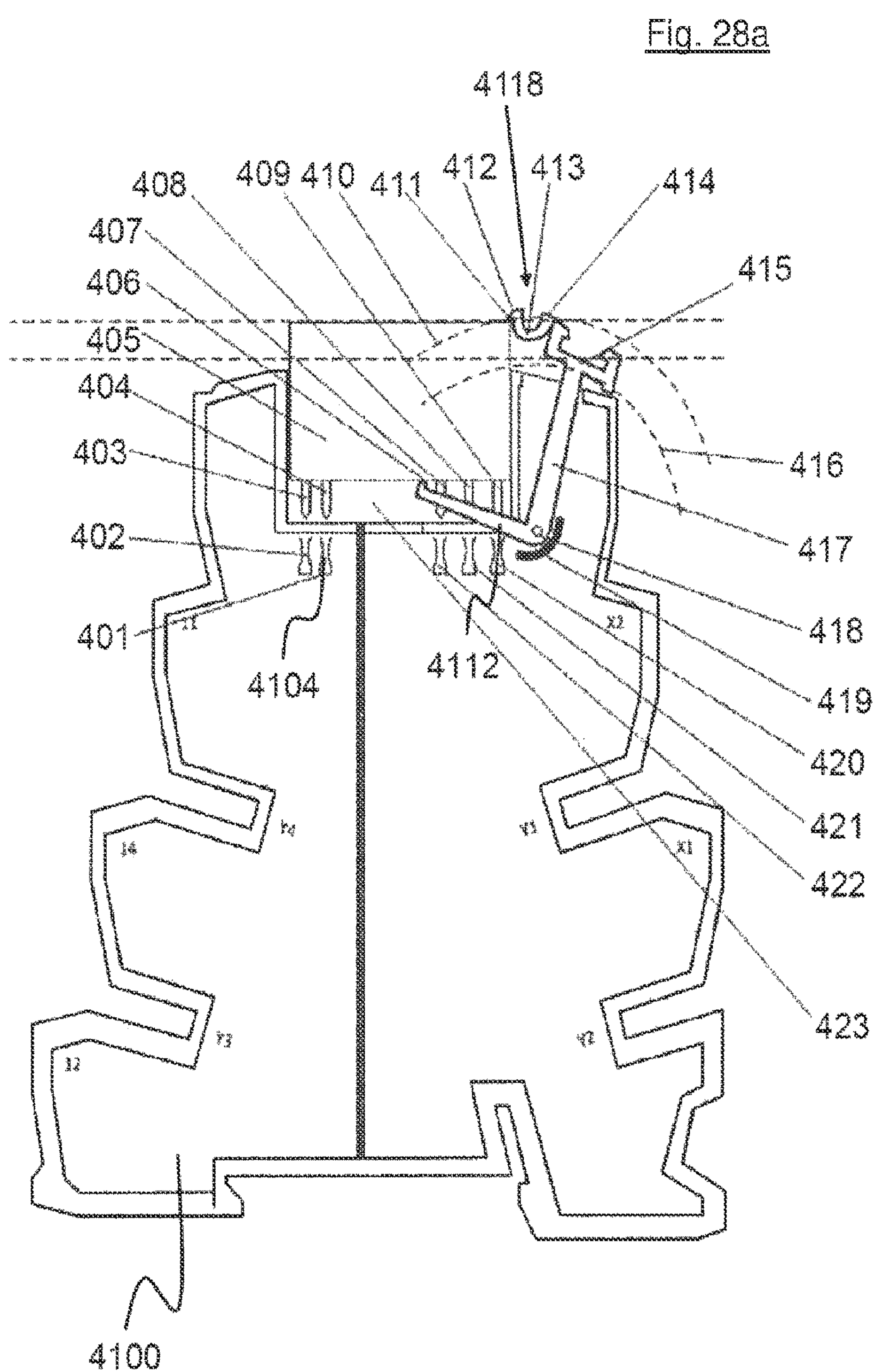
FIG. 28*a* shows the embodiment of FIG. 28 during or at the end of actuation.

FIG. 28*a* shows the embodiment of FIG. 28 with the accommodated component 405 moved to the passive position on the retaining means. The accommodated component 405 is held by buffering element 413 with the detent hook 411 thereof, outside the electrical component 4100. Furthermore, the accommodated component 405 is supported from below by the ejection portion 4112. Thus, the accommodated component 405 is supported on all of its sides, on the left and right sides by the left and right slot walls 446 and 448, from below by the ejection portion 4112, and on top by the locking means 411 of the retaining means. The accommodated component 405 has reached the position 437. Here, the accommodated component 405 was transferred from the active position 438 to the passive position 437 by a pressure force which is exerted on the actuation portion 4112 of the ejection device 4110. In the passive position 437, the accommodated component 405 is electrically separated from the electrical component 4100. More particularly, the first electrical terminals of the accommodated component 405 are spaced apart from the second electrical terminals 4104 of the electrical component 4100 in this case.

Figure 29:
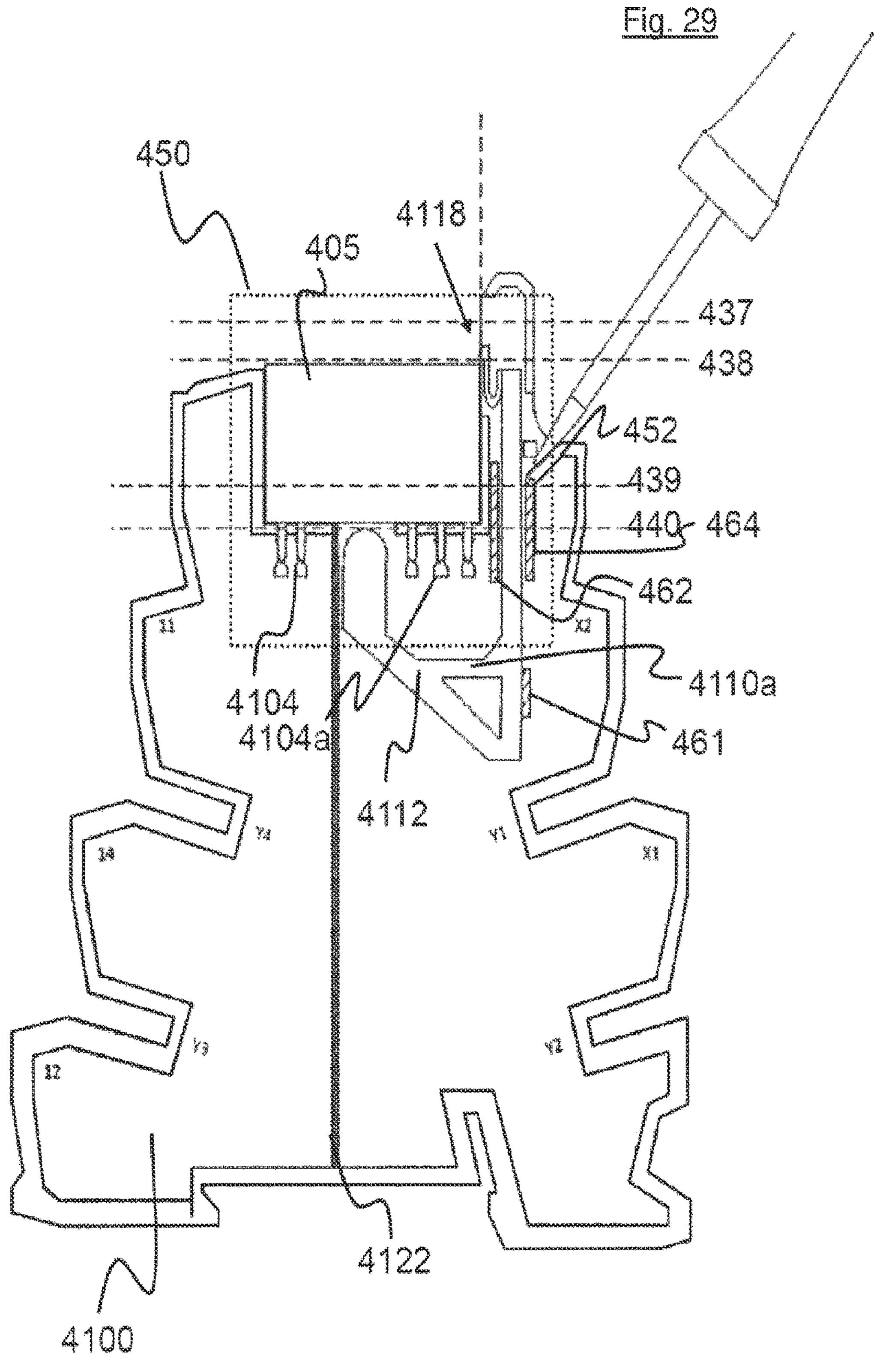
FIG. 29 shows a further embodiment of the present disclosure.

Referring to FIG. 29 which shows a further embodiment in which the ejection device 4110 is made in one piece, so that the actuating lever 417 is formed integrally with the ejection portion 4112. A strut 4110*a* serves to strengthen or stiffen the ejection device 4110. This portion of the ejection device 4110 could also be made from solid material or with different recesses without departing from the scope of the present specification. In this example, the ejection device 4110 is designed as a type of slider that does not need to be pivoted. The ejection of the accommodated component 405 from the slot 423 can be effected by a vertical displacement. Engagement points 461, 462 and 464 are provided for supporting the actuating lever 417 such that the ejection device 4110 does not perform any rotational movement, or only a smallest possible rotational movement, even when being actuated, but rather via a translational movement in the upward direction to eject the accommodated component 405 from slot 423.

The embodiment of FIG. 29 comprises a partitioning wall 4122 which improves the electrical insulation between terminals 4104 and terminals 4104*a*. The ejection device 4110 can be arranged entirely on only one side of the partitioning wall 4122 in this embodiment. The same reference numerals and descriptions of components from FIG. 28 are applied accordingly for FIG. 29, without this being specified in detail.

Figure 29A:
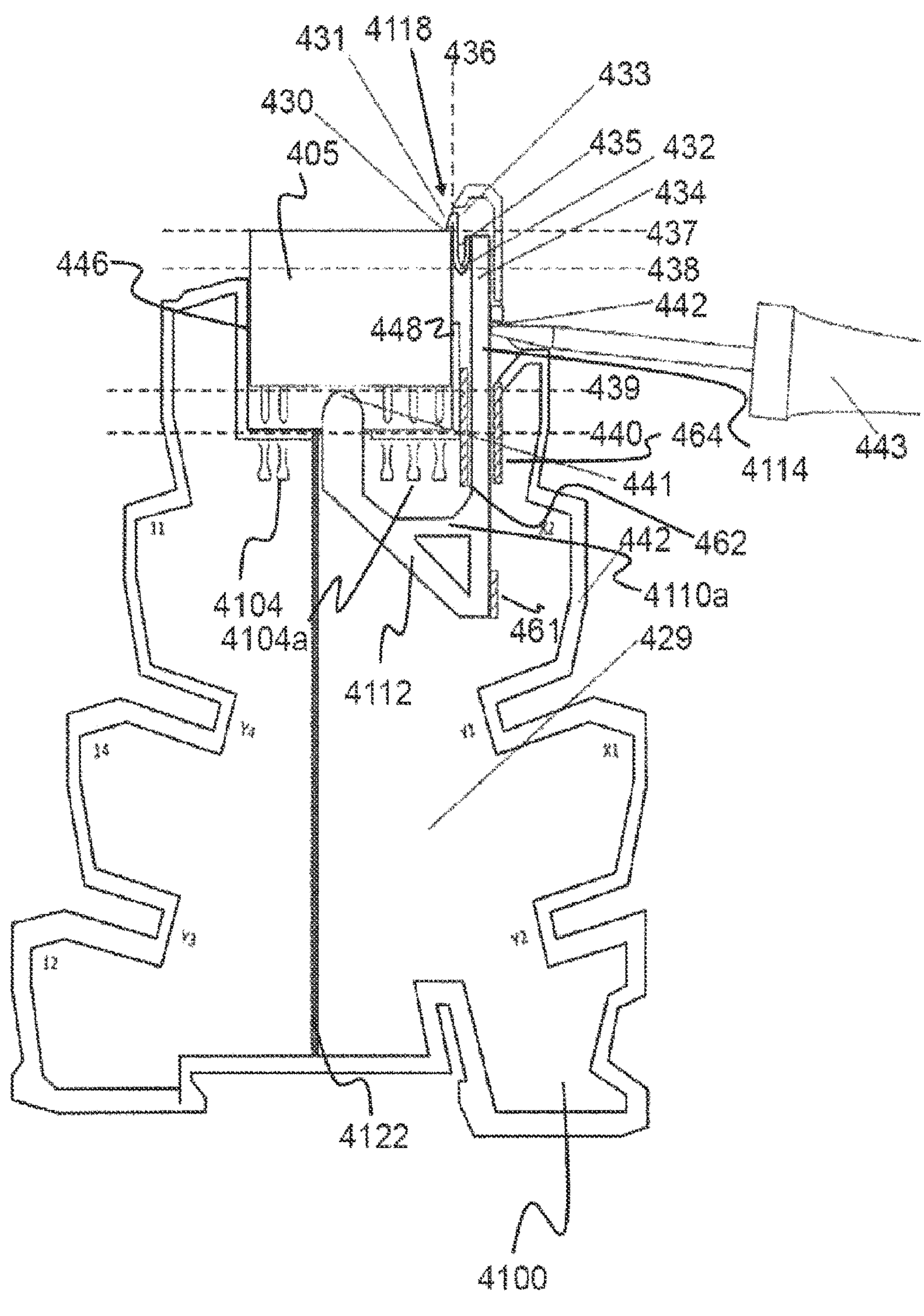
FIG. 29*a* shows the embodiment of FIG. 29 during or at the end of actuation.

FIG. 29*a* shows the embodiment of FIG. 29 with the accommodated component 405 transferred into the passive position 437. By exerting a pressure force on the actuation portion 4114 together with a downward rotary or rotational movement of the hand tool 443, the actuation portion 4114 is translated upwards, and simultaneously the ejection portion 4112 which is formed integrally therewith is displaced in an upward direction to eject the component 405 accommodated in slot 423. It will be appreciated here, that in the embodiment of FIGS. 29, 29*a* the ejection device 4110 does not interfere with the second electrical terminals 4104*a* of the electrical component 4100. This makes it possible to arrange the ejection device 4110 in a common plane with the electrical terminals 4104, 4104*a* of the electrical component 4100. The accommodated component 405 is held in the passive position 437 on all of its sides, i.e. from below by the ejection portion 4112, on either side by the slot walls 446, 448, and on top by locking means 431.

Referring further to FIG. 28 which shows an electrical component 4100 with an accommodated component 405 inserted therein, with the accommodated component 405 being inserted in the electrical component 4100 in its active position 438. Retaining means 414 partially covers the upper side of the accommodated component 405. Referring further to FIG. 28*a* which shows the accommodated component transferred into the passive position 437. The accommodated component 405 is retained by locking means 411 of the retaining means. The resiliency of buffering element 414 can be adjusted such that the accommodated component 405 cannot come out of the passive position 437 on its own, but such that the accommodated component can be removed manually by removing the I means 411 from the upper side of the accommodated component 405.

It will be apparent to a person skilled in the art that the embodiments as described above are meant to be exemplary and that the present disclosure is not limited thereto but can rather be varied in many ways without departing from the scope of the claims. Furthermore, it will be apparent that irrespective of whether disclosed in the description, the claims, the figures, or otherwise, the features also individually define individual components of the present disclosure, even if they have been described together with other features. Throughout the figures, the same reference numerals designate the same pieces of subject-matter, so that a description of pieces of subject-matter that are possibly only mentioned in one or at least not in conjunction with all figures can also be transferred to such figures with regard to which the piece of subject-matter has not explicitly been described in the specification.

The invention claimed is:

1. An electrical component, comprising:

at least one plug-in socket for accommodating an accommodated component, in particular a relay module or an optocoupler module, at least in a portion or partially in or on the electrical component, wherein the accommodated component comprises first electrical contact elements on its underside for being electrically connected to second electrical contact elements of the electrical component, wherein in an active position of the accommodated component in the plug-in socket the first electrical contact elements are electrically connected with the second electrical contact elements of the electrical component, and wherein the second electrical contact elements are arranged in a common contact plane, wherein the common contact plane extends vertically in a pull-out direction of the accommodated component and through the accommodated component;

a manipulation means by means of which the accommodated component can be inserted into its active position in the plug-in socket, and/or pulled out of the active position, wherein the manipulation means has a spacing portion, and wherein the spacing portion has a free end; and an ejection device for releasing and/or at least partially ejecting the accommodated component from the active position, wherein the ejection device further comprises an actuation portion for actuating the ejection device by using a hand tool, wherein the manipulation means is integrally formed with the actuation portion of the ejection device, wherein the ejection device further comprises an ejection portion connected to the actuation portion for ejecting the accommodated component from the plug-in socket when the actuation portion is actuated, and wherein the ejection portion is adapted and arranged so as to engage the accommodated component in the common contact plane for ejecting the accommodated component from the active position in the plug-in socket.

2. The electrical component according to claim 1, wherein the manipulation means has a grip means at the free end of the spacing portion, which is adapted to enable the manipulation means to be actuated.

3. The electrical component according to claim 2, wherein the manipulation means is an insertion and/or extraction aid, and/or wherein at least one of the following features are met:

the grip means is in the form of a tab on the free end of the spacing portion, which can be gripped manually;

the grip means is in the form of a T-bar or annular tab for being actuated by an actuation means or a hand tool, in order to pull the accommodated component out of the plug-in socket or to press it into the plug-in socket into the active position;

the spacing portion is in the form of a lever, a flexible lever, or is rod-shaped, or defines a cantilever arm, which is integrally molded.

4. The electrical component according to claim 1, wherein at a fixed end opposite the free end, the manipulation means is non-detachably connected to the electrical component.

5. The electrical component according to claim 4 wherein the fixed end of the manipulation means is connected to the ejection device of the electrical component and/or is integrally formed with the ejection device.

6. The electrical component according to claim 5, wherein actuation of the manipulation means causes the ejection device to move, wherein the manipulation means is adapted so as to actuate the ejection device when a pulling force is exerted on the manipulation means.

7. The electrical component according to claim 6, wherein the manipulation means is furthermore adapted such that the pulling force can be exerted on the manipulation means in a direction other than the pull-out direction of the accommodated component from the plug-in socket; and/or the force vector of the pulling force on the manipulation means for actuating the ejection device lies in the common contact plane; and/or the pulling force can be exerted on the manipulation means at an angle of greater than 30 degrees or greater than 60 degrees up to approximately perpendicular to the pull-out direction of the accommodated component.

8. The electrical component according to claim 1, wherein the accommodated component can be transferred into the active position in the plug-in socket by exerting a pressure force on the manipulation means.

9. The electrical component according to claim 1, further comprising a retaining means for retaining the accommodated component in a passive position on the electrical component, wherein in said passive position the first electrical contact elements of the accommodated component are electrically separated from the second electrical contact elements of the electrical component.

10. The electrical component according to claim 1, wherein the second electrical contact elements or part thereof are arranged in the common contact plane in the plug-in socket;

wherein said common contact plane extends through the first electrical contact elements of the accommodated component when the latter is plugged into the plug-in socket.

11. The electrical component according to claim 9, wherein the retaining means is arranged and adapted, when the ejection device is actuated, the accommodated component is automatically transferred into the passive position and is held there by the retaining means; and/or wherein the retaining means is automatically enabled or provided when the ejection device is actuated.

12. The electrical component according to claim 9, wherein the retaining means is connected to the manipulation means or integrally formed therewith; and/or wherein the retaining means is connected to or integrally formed with an actuation portion.

13. The electrical component according to claim 5, wherein the ejection device is adapted so as to be at least partially pivotable, and wherein pivoting of the manipulation means causes the accommodated component to be released or at least partially ejected from the plug-in socket.

14. The electrical component according to claim 5, wherein the ejection device is adapted so as to be displaceable, along an axis parallel to side walls of an accommodation slot, and wherein the displacement of the ejection device causes the accommodated component to be released or at least partially ejected from the plug-in socket.

15. The electrical component according to claim 1, wherein the ejection device is adapted so as to extend in the common contact plane around the second electrical contact elements or around part thereof.

16. The electrical component according to claim 1, wherein actuation of the ejection device causes at least the ejection portion to pivot; and/or wherein the ejection portion forms a toggle lever with the actuation portion.

17. An electrical component, comprising:

at least one plug-in socket for accommodating an accommodated component, in particular a relay module or an optocoupler module, at least in a portion or partially in or on the electrical component, wherein the accommodated component comprises first electrical contact elements on its underside for being electrically connected to second electrical contact elements of the electrical component, and wherein in an active position of the accommodated component in the plug-in socket the first electrical contact elements are electrically connected with the second electrical contact elements of the electrical component; and a manipulation means by means of which the accommodated component can be inserted into its active position in the plug-in socket, and/or pulled out of the active position, wherein the manipulation means has a spacing portion, and wherein the spacing portion has a free end; and an ejection device for releasing and/or at least partially ejecting the accommodated component from the active position, wherein the ejection device further comprises an actuation portion for actuating the ejection device by using a hand tool, and wherein the actuation portion is designed as a sliding portion which is slidably mounted in an actuation guide, the actuation guide comprises at least one engagement surface for absorbing rotational forces from the tool and/or the sliding portion and for retaining the sliding portion in the actuation guide.

18. An assembly, comprising an electrical component according to claim 1, and the accommodated component plugged into the plug-in socket.

* * * * *